(12) United States Patent
Hansen

(10) Patent No.: US 8,982,324 B2
(45) Date of Patent: Mar. 17, 2015

(54) POLARIZATION DESIGNS FOR LITHOGRAPHIC APPARATUS

(75) Inventor: Steven George Hansen, Phoenix, AZ (US)

(73) Assignee: ASML Holding N.V., Veldhoven (NL)

( * ) Notice: Subject to any disclaimer, the term of this patent is extended or adjusted under 35 U.S.C. 154(b) by 740 days.

(21) Appl. No.: 12/951,878

(22) Filed: Nov. 22, 2010

(65) Prior Publication Data

US 2011/0139027 A1    Jun. 16, 2011

Related U.S. Application Data

(60) Provisional application No. 61/286,716, filed on Dec. 15, 2009.

(51) Int. Cl.
*G03F 7/20* (2006.01)
*G03F 1/00* (2012.01)

(52) U.S. Cl.
CPC ........ *G03F 7/70125* (2013.01); *G03F 7/70566* (2013.01); *G03F 1/144* (2013.01)
USPC ................ 355/71; 355/52; 355/53; 355/55; 355/67; 355/77

(58) Field of Classification Search
USPC .......... 355/52, 53, 55, 67–71, 77; 250/492.1, 250/492.2, 492.22, 548; 430/5, 8, 22, 30, 430/311, 312, 321
See application file for complete search history.

(56) References Cited

U.S. PATENT DOCUMENTS 5,691,802 A * 11/1997 Takahashi ...................... 355/53
6,107,013 A * 8/2000 Fujisawa et al. ............... 430/494
7,090,964 B2    8/2006 Baba-Ali
7,133,119 B1    11/2006 Pettibone
7,266,480 B2    9/2007 Adam (Continued)

FOREIGN PATENT DOCUMENTS

DE    102008011134    10/2008
EP    1 630 614    3/2006

(Continued)

OTHER PUBLICATIONS

Nabila Baba-Ali et al., "Overcoming the Resolution Challenge Using Special Illumination Techniques to Print 50/50 nm Nested Contact Holes at 157 nm Wavelength," Proc. SPIE, vol. 5040, 1352-1362 (2003).

(Continued)

*Primary Examiner* — Christina Riddle
(74) *Attorney, Agent, or Firm* — Pillsbury Winthrop Shaw Pittman LLP

(57) ABSTRACT

Improved low $k_1$ lithographic imaging is disclosed by optimizing or improving an illumination polarization condition. The polarization condition may be a pre-defined spatially varying polarization, or a spatially customized local polarization of bright illumination points based on tracking a value of a desired lithographic response. Several non-traditional polarization conditions, e.g., TM/TE polarization (with or without a central TM region), diagonal polarization, and Y+X polarization (typically for dark field illumination) are disclosed, that offer substantial imaging advantages for specific lithographic problems, especially at low $k_1$ values. The initial polarization definition may be limited to specific fixed polarization angles.

20 Claims, 49 Drawing Sheets

(56) References Cited

U.S. PATENT DOCUMENTS

| | | |
|---|---|---|
| 7,292,315 B2 | 11/2007 | Socha et al. |
| 7,352,443 B2 | 4/2008 | De Winter |
| 7,359,033 B2 | 4/2008 | Yamazoe |
| 7,684,013 B2 | 3/2010 | Hansen et al. |
| 8,194,231 B2 | 6/2012 | Mulder et al. |
| 2004/0057036 A1* | 3/2004 | Kawashima et al. ............ 355/77 |
| 2004/0180294 A1* | 9/2004 | Baba-Ali et al. .............. 430/311 |
| 2005/0134822 A1* | 6/2005 | Socha et al. ................... 355/69 |
| 2006/0046168 A1* | 3/2006 | Fukuhara ........................ 430/30 |
| 2006/0055909 A1* | 3/2006 | Fiolka et al. .................... 355/71 |
| 2006/0126046 A1* | 6/2006 | Hansen ........................... 355/55 |
| 2006/0221453 A1 | 10/2006 | Koehler et al. |
| 2007/0002300 A1* | 1/2007 | Hansen et al. .................. 355/67 |
| 2007/0263192 A1* | 11/2007 | Bubke et al. .................... 355/53 |
| 2008/0043215 A1 | 2/2008 | Socha |
| 2008/0158529 A1 | 7/2008 | Hansen |
| 2008/0218725 A1 | 9/2008 | Fiolka |
| 2009/0109415 A1 | 4/2009 | Mulder et al. |
| 2009/0265148 A1* | 10/2009 | Zhang et al. ...................... 703/2 |
| 2010/0315614 A1 | 12/2010 | Hansen |
| 2011/0149261 A1* | 6/2011 | Saenger et al. ................. 355/71 |
| 2012/0075603 A1 | 3/2012 | Hansen et al. |
| 2012/0075605 A1 | 3/2012 | Chen |

FOREIGN PATENT DOCUMENTS

| | | |
|---|---|---|
| JP | 2005-183938 | 7/2005 |
| JP | 2006-066440 | 3/2006 |
| JP | 2006-511967 | 4/2006 |
| JP | 2006-324664 | 11/2006 |
| JP | 2008-166777 | 7/2008 |
| JP | 2008-258637 | 10/2008 |
| JP | 2009-111361 | 5/2009 |
| JP | 2012-069945 | 4/2012 |
| JP | 2012-074695 | 4/2012 |
| WO | 2004/077154 | 9/2004 |

OTHER PUBLICATIONS

Yoshiyuki Sekine, et al., "Analysis of Imaging Properties for Hyper-NA ArF Immersion Lithography," Proc SPIE, vol. 5754, 701-709 (2005).

Japanese Office Action mailed Sep. 2, 2014 in corresponding Japanese Patent Application No. 2010-273137.

* cited by examiner

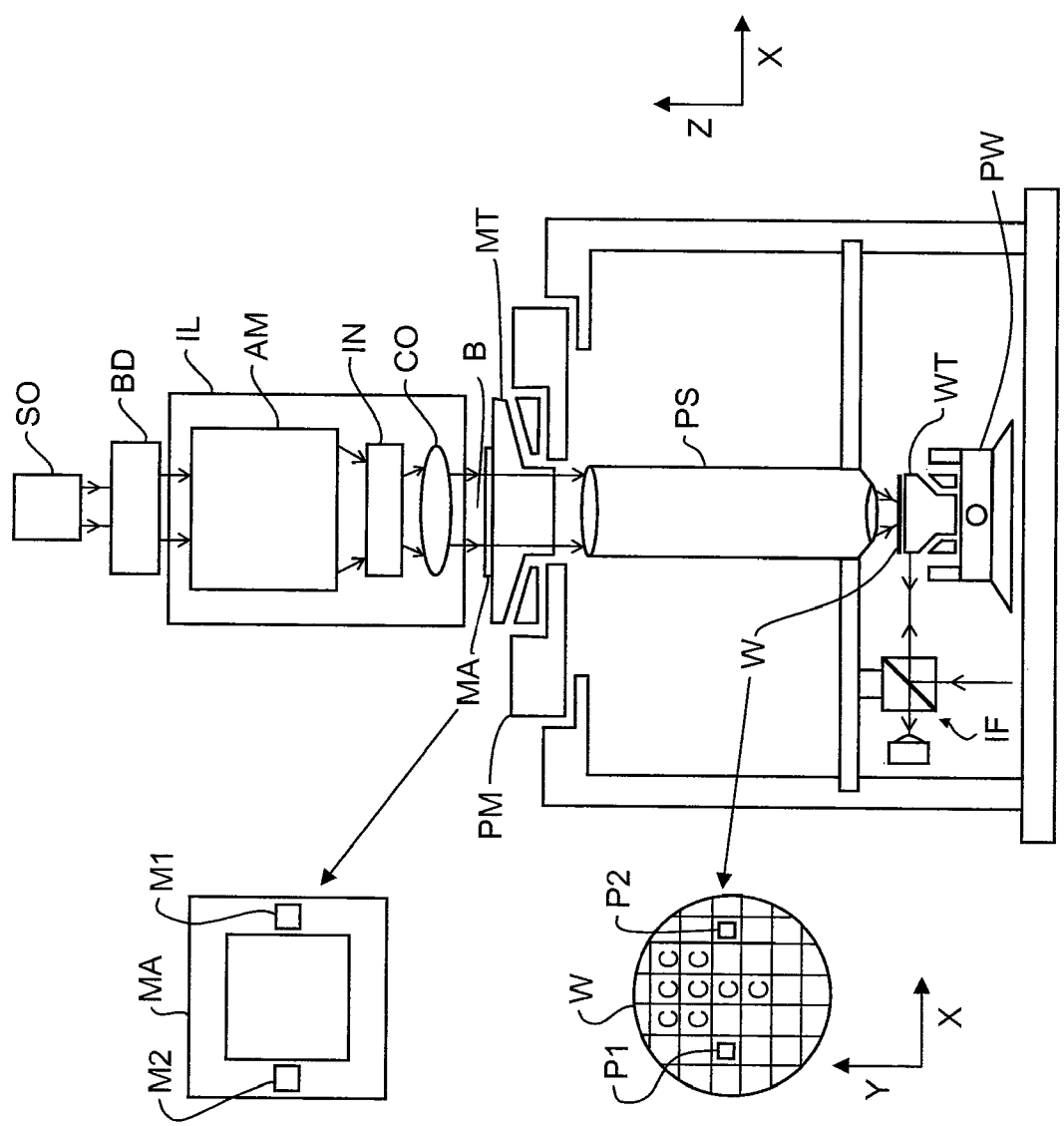

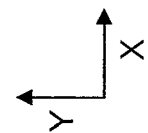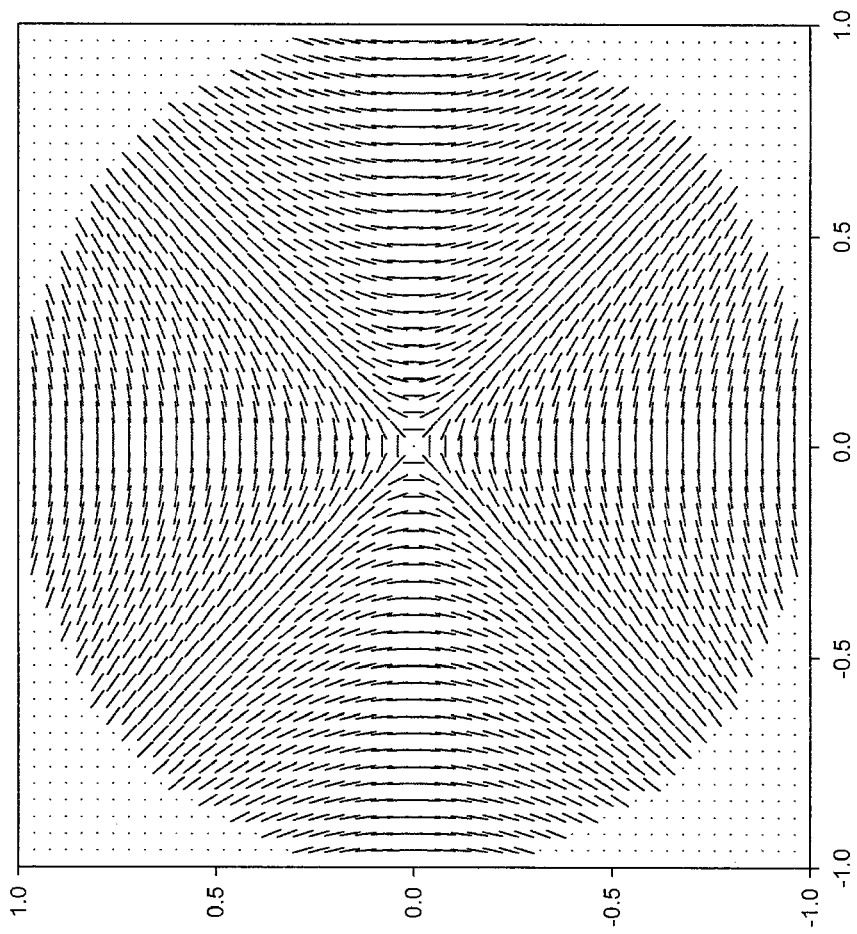
FIG. 2E

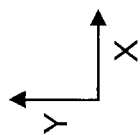
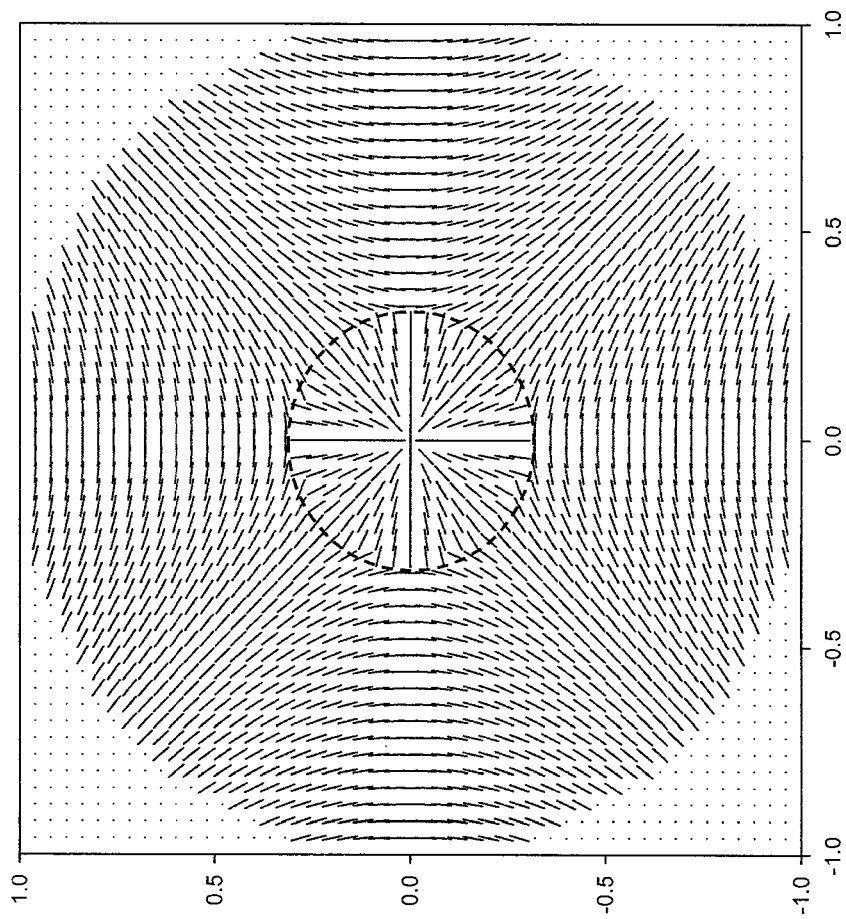
FIG. 2F

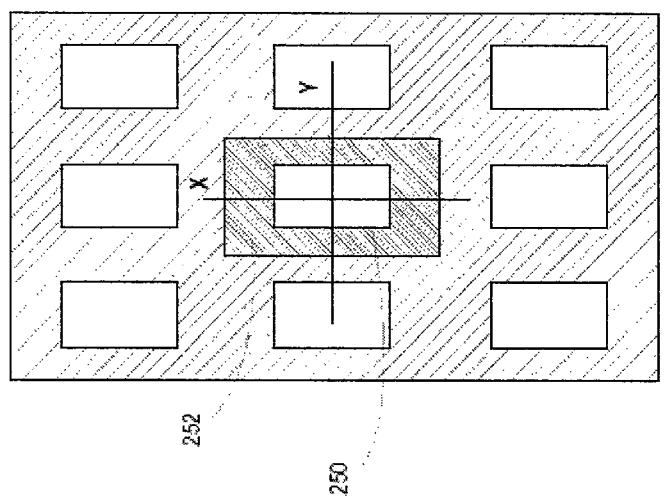

| | mask aspect ratio | NILS y | NILS x |
|---|---|---|---|
| unpol | 1.29 | 1.25 | 1.44 |
| TM | 1.13 | 1.61 | 1.84 |
| diag | 1.42 | 1.43 | 1.65 |
| TM/TE | 1.61 | 1.25 | 1.47 |
| X+Y | 1.86 | 0.87 | 1.01 |

FIG. 2P

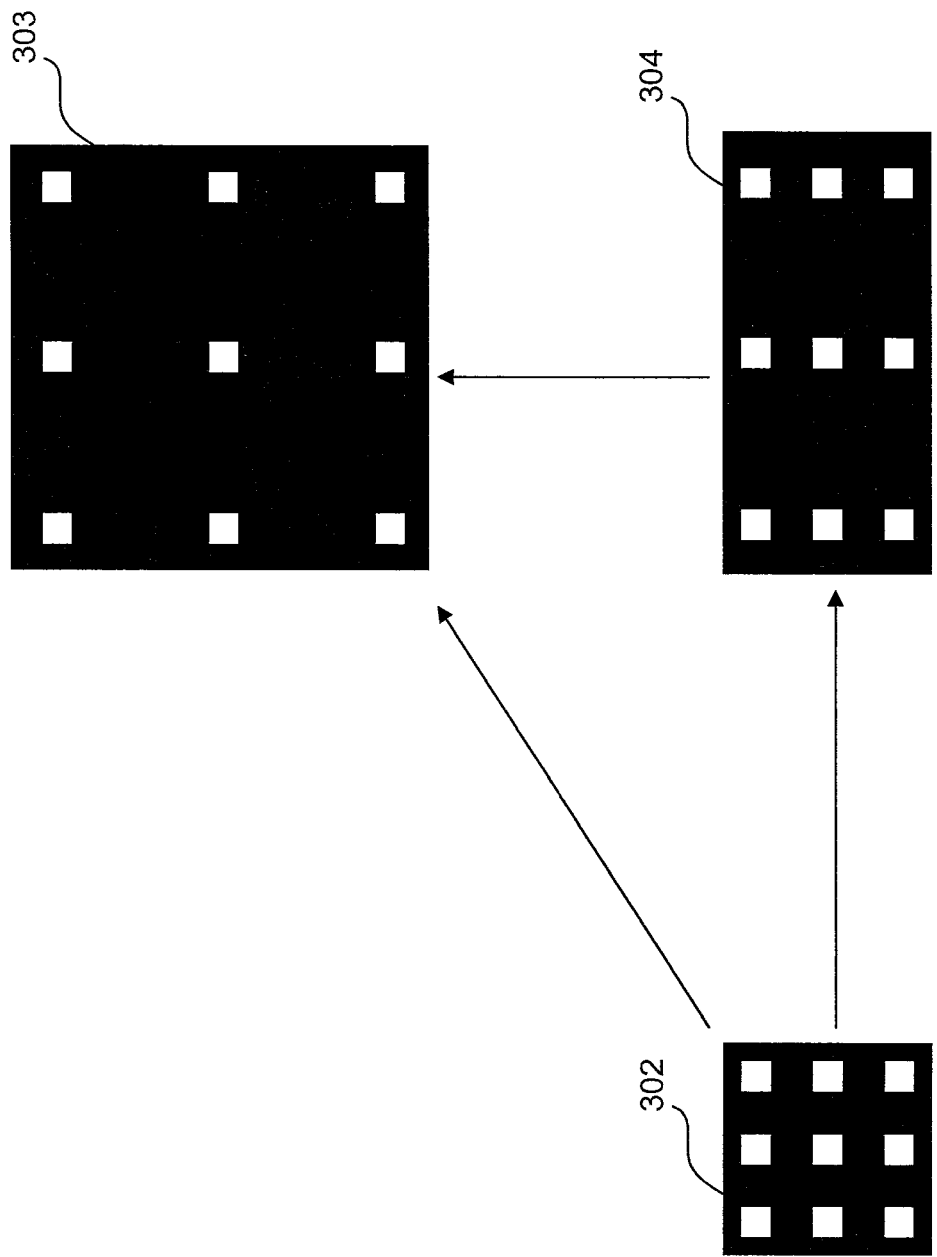

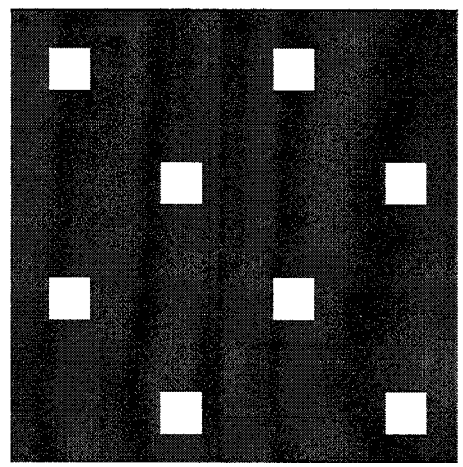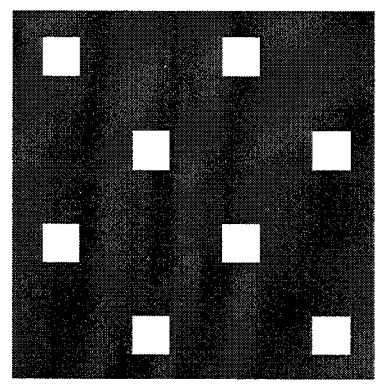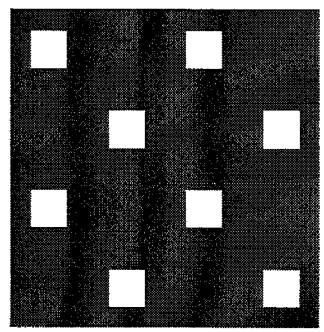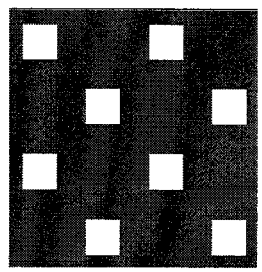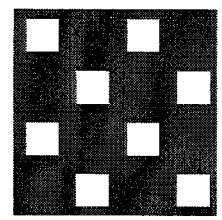
FIG. 4

| mask type | polarization | opt bias | MEEF | metric |
|---|---|---|---|---|
| BIM | unpol | 14.5 | 3.43 | 11.19 |
| 6% | unpol | 21.1 | 3.09 | 10.21 |
| 18% | unpol | 26.5 | 2.80 | 9.73 |
| BIM | TM | 14.7 | 3.72 | 12.07 |
| 6% | TM | 17.8 | 3.01 | 9.55 |
| 18% | TM | 18.8 | 2.44 | 8.25 |

POLARIZATION DESIGNS FOR LITHOGRAPHIC APPARATUS

This application claims priority and benefit under 35 U.S.C. §119(e) to U.S. Provisional Patent Application No. 61/286,716, filed on Dec. 15, 2009, which is incorporated herein in its entirety by reference.

FIELD

The invention relates to improved polarized illumination in a lithographic apparatus to obtain better imaging in a device manufacturing process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

One of the goals in device manufacturing processes using a lithographic apparatus is to faithfully reproduce the desired device pattern on the substrate using the patterning device. In order to do that, illumination should be optimized to produce greater image contrast even at or near the resolution limit. Polarized illumination is a tool to achieve better imaging, especially for a lithographic process having a low $k_1$ value, where $k_1$ is a process dependent adjustment factor related to the, achievable resolution R, as given by the Rayleigh criterion of equation (1):

$$R = k_1 * (\lambda/NA) \quad (1)$$

where $\lambda$ is the wavelength of the radiation used, and NA is the numerical aperture of the projection system used.

SUMMARY

Standard polarization, such as linear X-polarization, linear Y-polarization, X+Y polarization, TE (azimuthal) polarization, TM (radial) polarization, etc. may be used in lithographic processes. By choosing the best of these polarization conditions for a particular imaging problem, lithographers can improve or maximize image contrast given by Normalized Image Log Slope (NILS) values. Such polarization conditions may also offer one or more other desirable advantages such as higher dose latitude, lower Mask Error Enhancement Factor (MEEF), and/or lower line edge roughness (LER), thus enabling successful imaging at lower $k_1$ values. For example, TM polarization can be beneficial in dense, square grid array of holes with relatively low $k_1$ values. For reference, see, e.g., U.S. Pat. Nos. 7,090,964, 7,352,443, and 7,359,033.

Optimum or beneficial polarization selection is not obvious for various imaging problems. For example, polarization selection is not obvious for various complex two-dimensional patterns that may appear in latest ICs or devices. Such patterns can produce complex diffraction patterns. For example, standard polarization (e.g. X+Y polarization) of low k1 2-D patterns may not provide the best imaging. Thus, it would be beneficial to provide a universal technique to select an improved illumination polarization along with other controllable lithographic parameters when it is difficult to predict the right polarization condition beforehand.

Embodiments of the invention provide solutions to the above-mentioned limitations of the current lithographic techniques by determining an optimized or beneficial illumination polarization condition. Such determination of the polarization condition can be achieved by choosing a pre-defined spatially varying optimum or beneficial polarization, or by spatially customizing local polarization of bright illumination points based on tracking best values of desired lithographic responses. The polarization optimization enhances the effectiveness of conventional source mask optimization (SMO) by introducing additional degrees of freedom on the source side in the form of polarization control. Thus, the process can be referred to as source mask polarization optimization, abbreviated as SMPO.

According to an aspect of the invention, a method of improving a transfer of an image of a patterning device layout onto a substrate with a lithographic apparatus is disclosed. The method comprises performing a first process corresponding to each of a plurality of predefined polarization conditions to select a predefined polarization condition that result in a lithographic response value associated with relatively better reproduction of a critical feature; and performing a second process to iteratively arrive at a desired spatially varying freeform polarization condition that results in a desired value of the lithographic response, wherein the second process uses one or more of the predefined polarization conditions used in the first process.

According to other aspects of the invention, several non-traditional polarization conditions, e.g., TM/TE polarization (with or without a central region that has a different polarization, such as, TM, X, Y or Y+X polarization), diagonal polarization, and Y+X polarization (for dark field illumination) are disclosed, that offer substantial imaging advantages for specific lithographic problems, especially at lower $k_1$ values: In an embodiment, rather than polarization type, such as X, Y, X+Y, TM, TE etc., directionality of the polarization can be locally varied (such as, 90°, 45°, and 22.5° polarization) in a source pupil plane.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1 schematically depicts a lithographic apparatus according to an embodiment of the invention;

FIG. 2A-2F and 2Q schematically depict various predefined polarization conditions, according to embodiments of the invention.

FIG. 2H-K show results of rectangular hole imaging using various polarization conditions, according to embodiments of the invention.

FIG. 2L-P show interaction of optical proximity correction (OPC) and polarization condition, according to embodiments of the invention.

FIGS. 3-5 schematically show various test patterns used in embodiments of the invention.

DETAILED DESCRIPTION

Figure 2A:
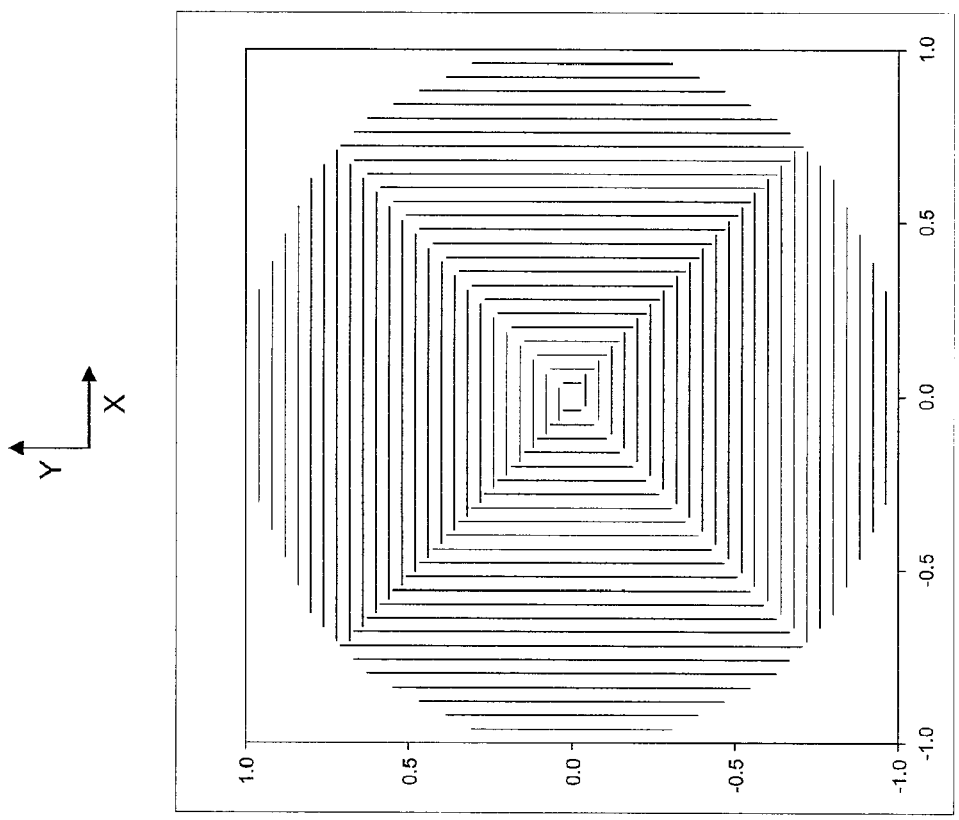
Figure 2B:
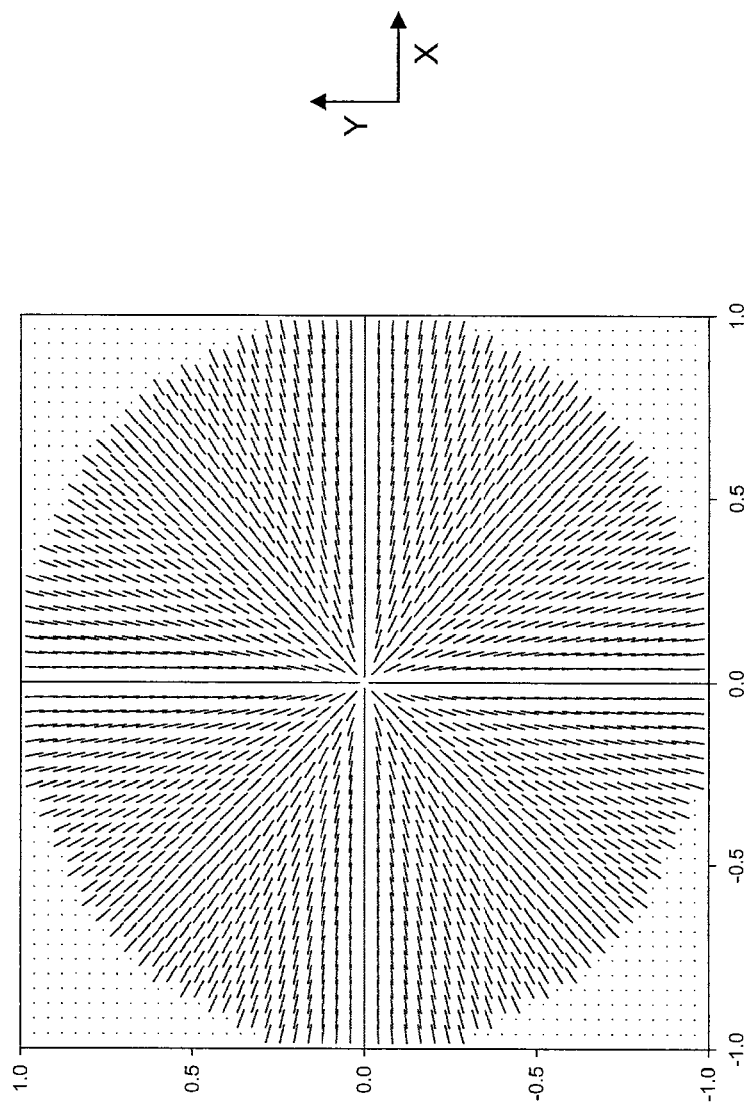

In generating the critical device patterns with the desired resolution in a lithography process, the type of pattern of the patterning device (e.g., mask) and illumination condition of the patterning device pattern are significant parameters. A combined optimization or determination of illumination and pattern is generally known as Source-Mask Optimization (SMO). An embodiment of the invention combines polarization fine tuning with traditional or customized SMO techniques to further enhance imaging of critical features of a pattern.

To approach the ultimate resolving power of a given lithography tool, various Resolution Enhancement Techniques (RETs) are widely used in or on a patterning device. Apart from the traditional binary masks, attenuated phase-shift masks (PSMs) and alternating PSMs can be used. Further, the combination of the right patterning device with off-axis illumination techniques, and variation of NA and/or sigma (sigma being the partial coherence or fill factor) settings that the lithography tools permit, offer lithographers a wide range of possibilities when setting the printing conditions of a given pattern.

Many lithographers have used X+Y polarization to enhance imaging for 2-dimensional dense patterns. However, according to an embodiment of invention, it has been discovered that polarization having a non-traditional (predefined or customizable) polarization condition has a significant advantage in imaging beyond the previous polarization techniques. The polarization determination and/or conditions described herein can be done in conjunction with existing or custom methods of SMO and/or with full-blown or simplified/modified OPC techniques.

To ascertain whether a particular polarization condition improves imaging performance, one or more lithographic response values may be compared using process parameters that are either fixed or varying within a pre-specified process budget. Computer simulation tools, such as, PROLITH™, LithoCruiser™, Tachyon™ SMO, etc. help simulate various lithography process parameters without doing an actual experiment. Various test pattern features that emulate an actual layout of a patterning device pattern, especially the regions in the layout that include critical features, are used. Simulation can be done over multiple cutlines (simulation sites) in the test pattern. Cutlines can be placed on a variety of test patterns of an actual structure and/or on several key pitches or corner areas. Desired lithography response values are tracked using a performance metric. The combination of process parameters, illumination conditions, and test features that results in the most desired lithography response value is typically chosen for the actual device manufacturing process.

Lithography Tool

A typical lithographic apparatus is described, in which embodiments of the invention may be implemented. FIG. 1 schematically depicts an example lithographic apparatus. The apparatus comprises:

an illumination system (illuminator) IL configured to condition a radiation beam B (e.g. UV radiation or DUV radiation);

a support structure (e.g. a mask table) MT constructed to hold a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the, exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables/support structure may be used in parallel, or preparatory steps may be carried out on one or more tables/support structure while one or more other tables/support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Types of Polarization Conditions

As described before, an embodiment of the invention determines illumination polarization conditions that yield improved imaging.

FIGS. 2A-2F illustrate examples of predefined polarization conditions in a pupil plane of the lithography tool. FIGS. 2A-2E show X+Y, TM, diagonal, TE and TM/TE polarizations, respectively. For 2-D device patterns, X+Y is commonly used by lithographers. Further, TM, TE, X and Y polarizations are known. For example, X and Y polarizations are often used for patterns which have a specific orientation, e.g., lines that are all parallel to each other.

The utility of a polarization condition can be predicted by analysis of diffraction patterns of typical test patterns, such as rectangular hole grid arrays. The image of these test patterns is often formed by multiple diffraction orders, and the optimal coupling of higher-amplitude diffraction orders may require a different polarization condition than that of the zeroth diffraction order. For example, TM polarization offers beneficial results for a square hole grid with resonant quadrupole illumination. With an attenuated PSM, TM polarization gives better imaging, because the high amplitude 01 and 10 diffraction orders interfere with each other, enhancing image contrast.

However, it has been discovered that a non-traditional polarization condition may harness imaging benefit for a full spectrum of patterning device patterns. Some of the non-traditional polarization conditions used in embodiments of the invention give even better imaging of rectangular hole arrays and other patterns, as described below.

Figures 2C, 2D:
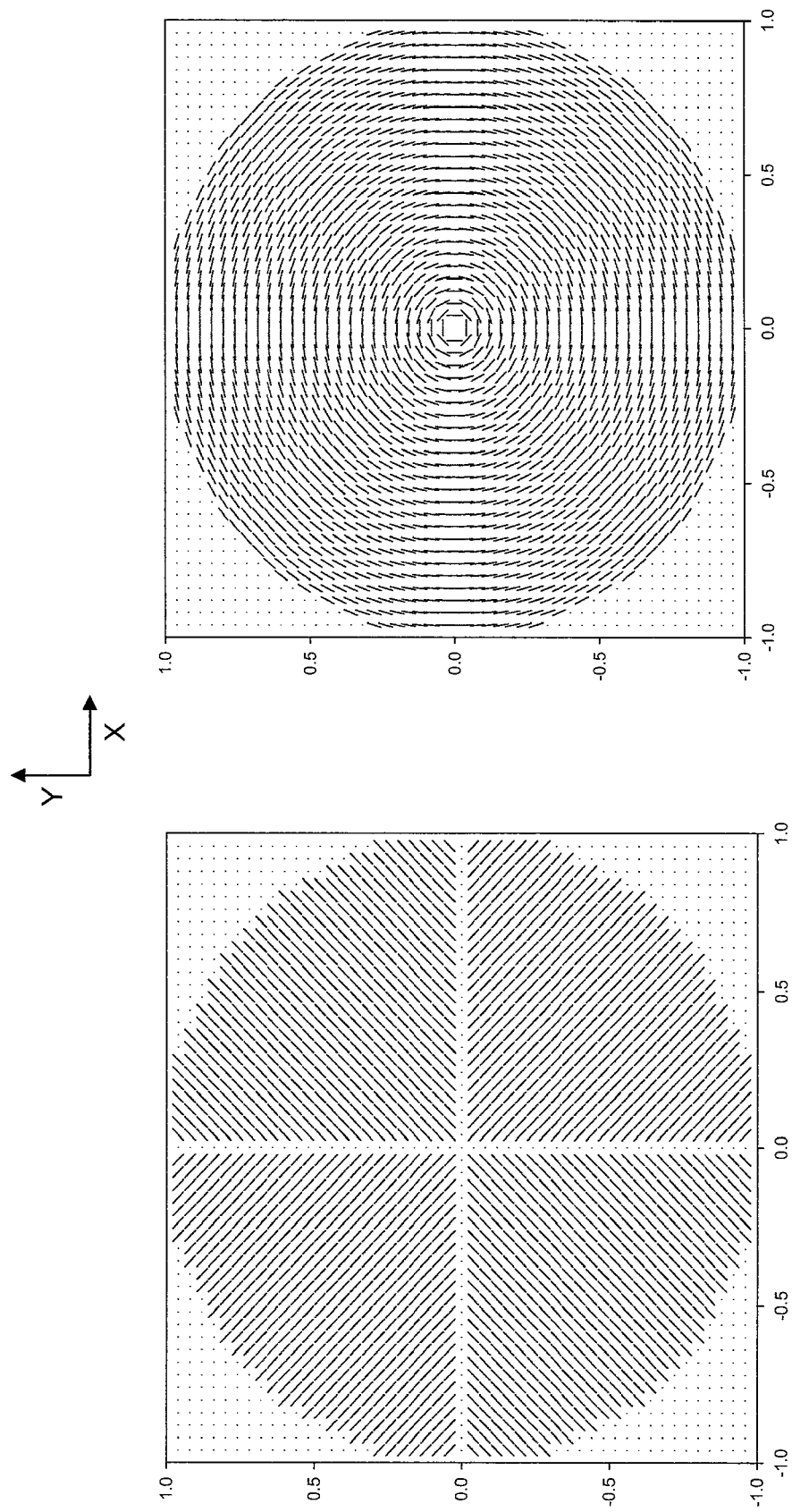

Diagonal polarization: FIG. 2C shows a diagonal polarization condition, wherein each quadrant at a pupil plane of the radiation system, a direction of the polarization vector is parallel to a 45° diagonal of the respective quadrant. It is believed this characteristic improves the alignment of the polarization vectors for 01 and 10 diffraction orders for the resonant 4-pole illumination, giving better imaging for rectangular hole grids than TM polarization.

TM/TE polarization: FIG. 2E shows a TM/TE polarization, where at a pupil plane of the radiation system, TM polarization is applied along diagonals, and in each quadrant of the pupil plane, TM polarization gradually and symmetrically transforms into TE polarization at the Cartesian X and Y axes. Note that the name TM/TE polarization is not a standard term, and is used here to refer to the type of polarization shown in FIG. 2E. As will be discussed later, TM/TE polarization offers an imaging advantage for certain patterns, for example, rectangular hole grids. It is believed that this characteristic makes the 01 and 10 diffraction orders parallel to each other for resonant 4-pole illumination, giving better imaging of rectangular hole grids compared to TM and diagonal polarization.

Y+X polarization: Another type of non-traditional polarization condition that may be used in an embodiment of the invention is a Y+X polarization, that is shown in FIG. 2Q. In a Y+X polarization, the direction of the polarization vectors are orthogonal to the direction of the polarization vectors in the standard X+Y condition depicted in FIG. 2A.

Any combination of the above polarizations conditions may be used to customize the polarization in the pupil plane. For example, using a fill factor σ different than 1, a combination polarization condition can be achieved, as shown in the example in FIG. 2F, where a central region (shown within a dashed circular outline) has a TM polarization with σ<0.3 and TM/TE polarization is applied around the periphery, and outside, of the central region of the pupil plane. In an embodiment, the transition zone between the central TM region and the peripheral TM/TE region is smoothed so that it is essentially seamless. However, because optimum or improved illumination shapes for low k1 imaging are "sparse", the polarization definition in the transition zone might not be critical, as the transition zone may not have any bright intensity points.

Figure 2G:
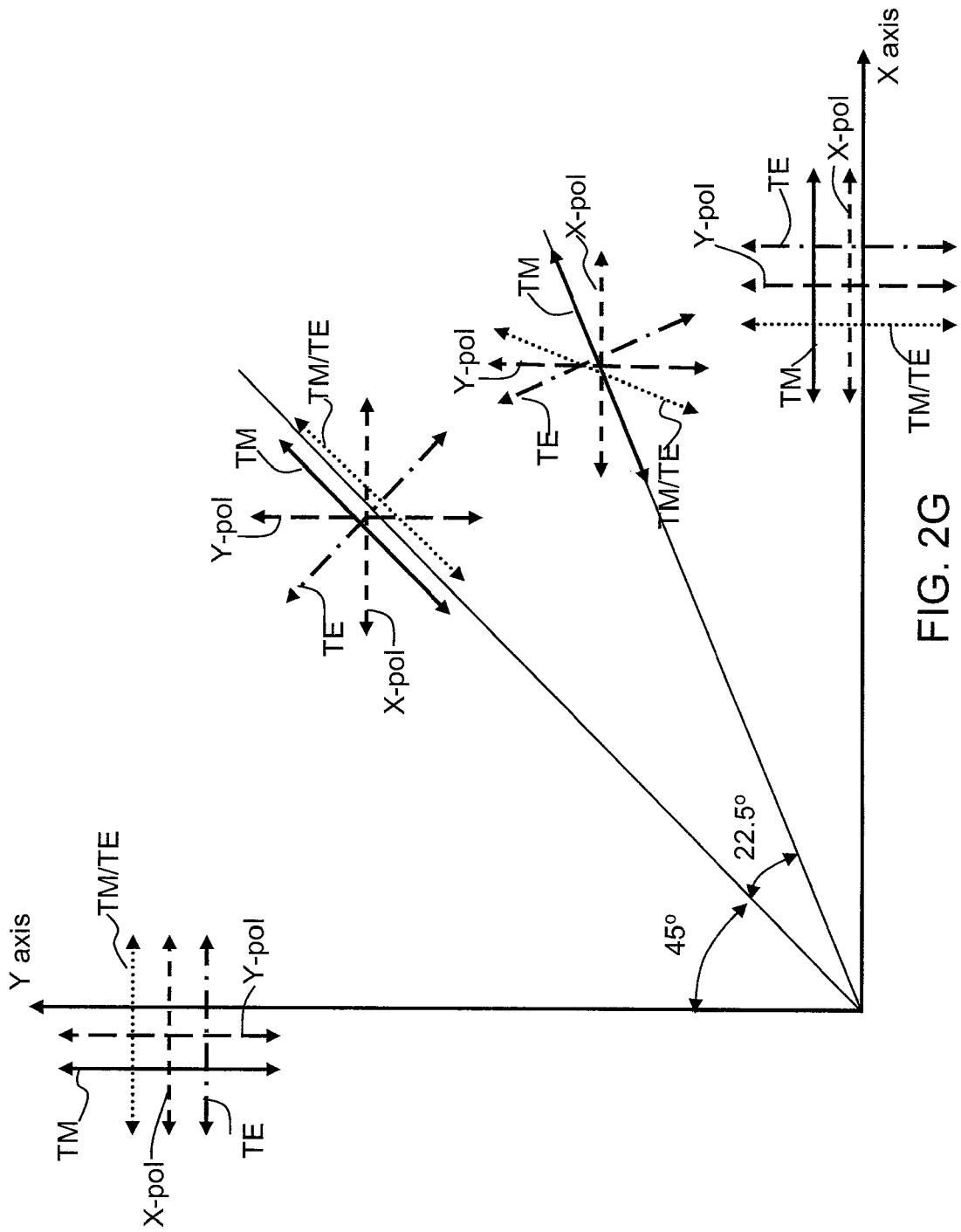
FIG. 2G shows polarization vector orientation difference for various predefined polarization conditions.
Figure 21:
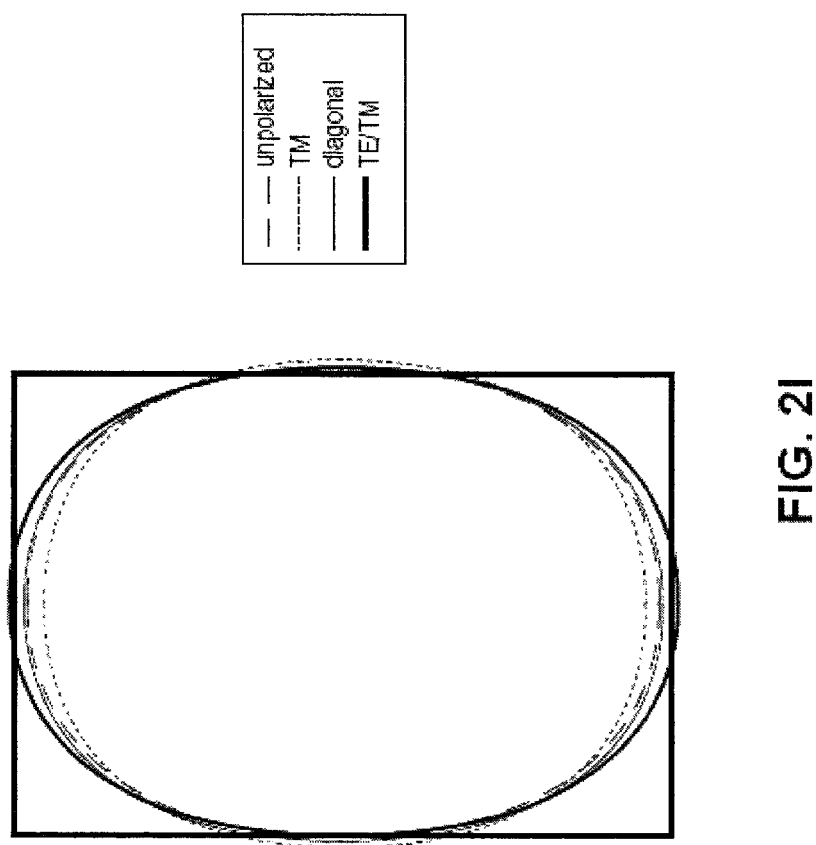
Figure 2K:
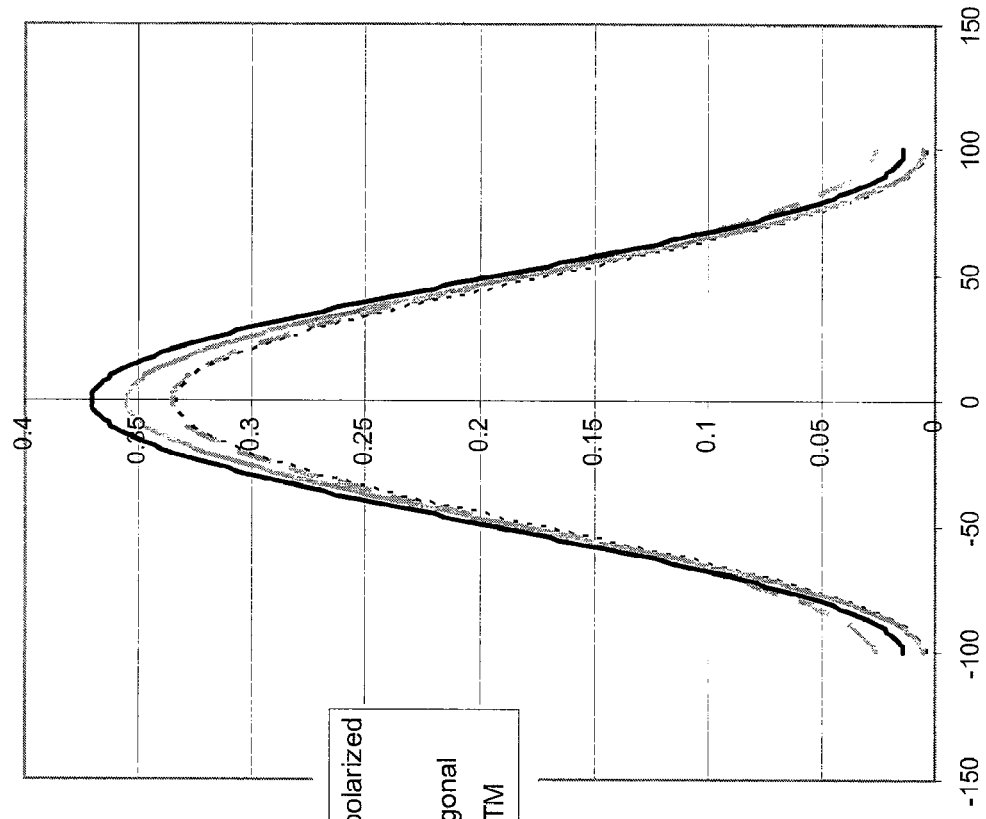

FIG. 2G shows the direction of polarization vectors at different spatial locations with respect to Cartesian X-Y axes corresponding to various predefined polarization conditions.

Figure 2J:
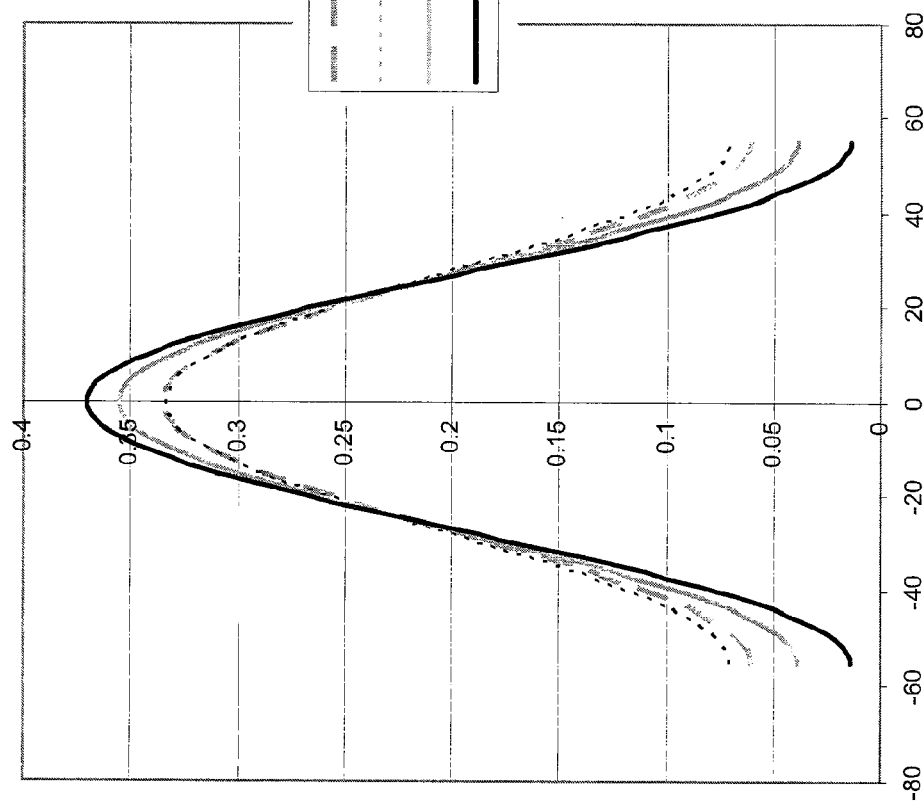
Figure 2M:
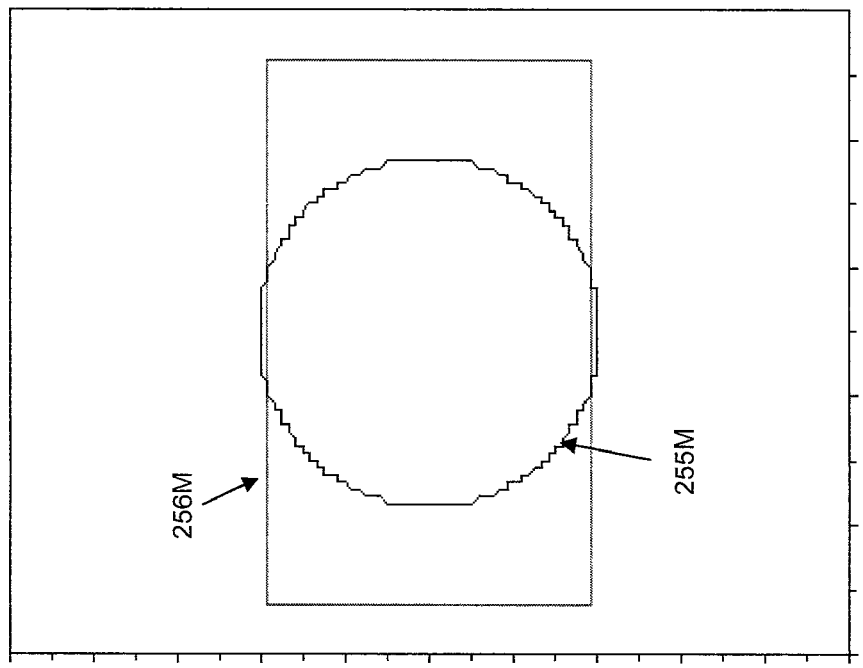
Figure 2L:
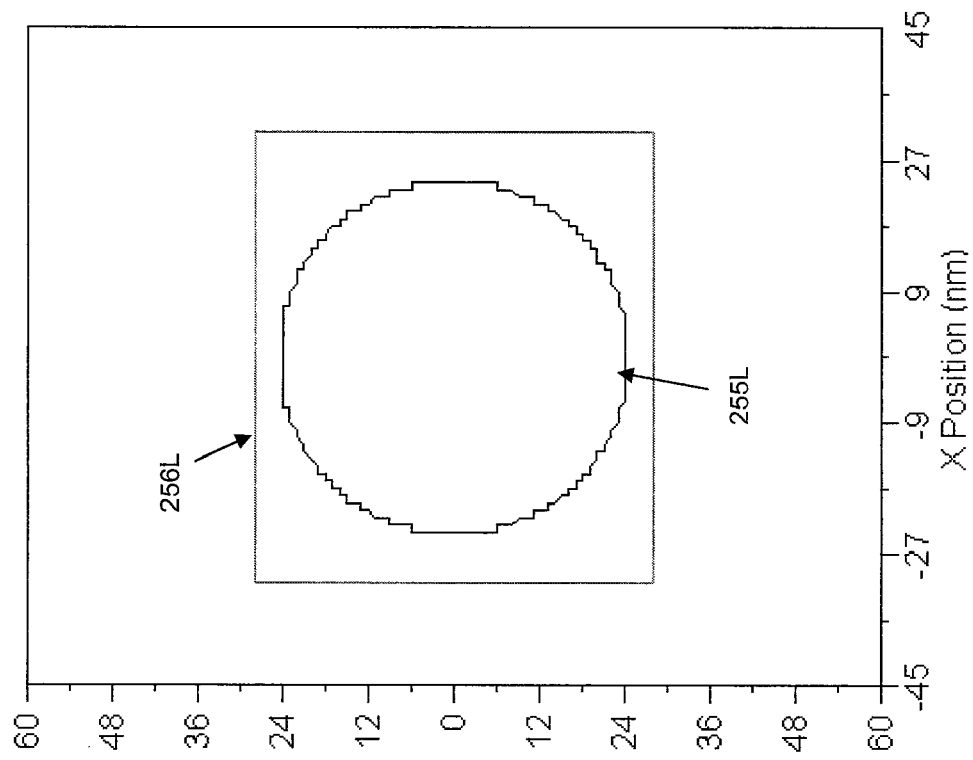
Figure 2O:
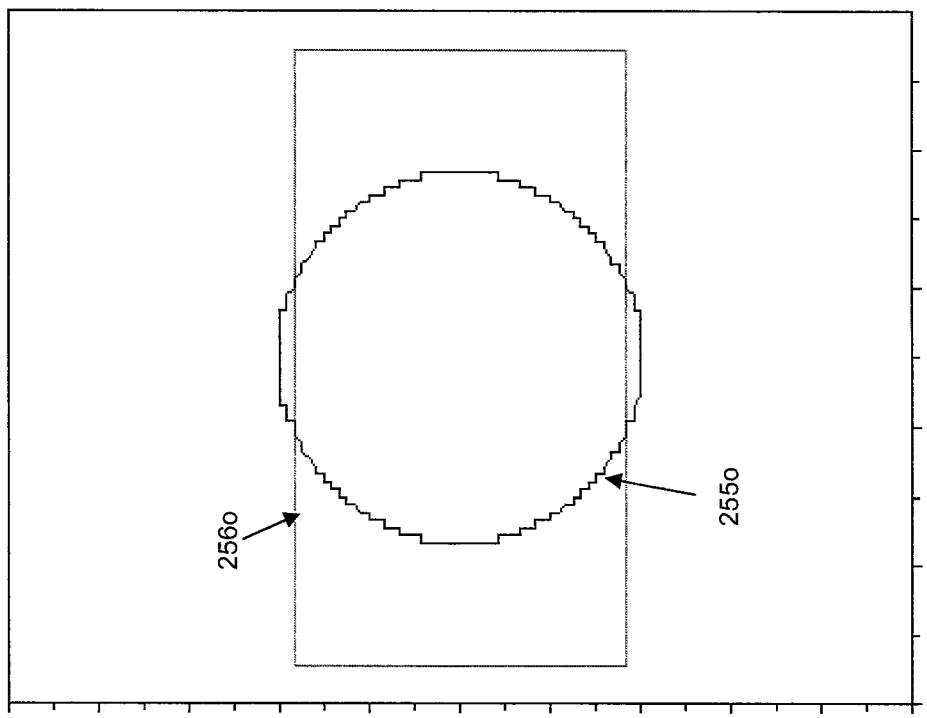
Figure 2N:
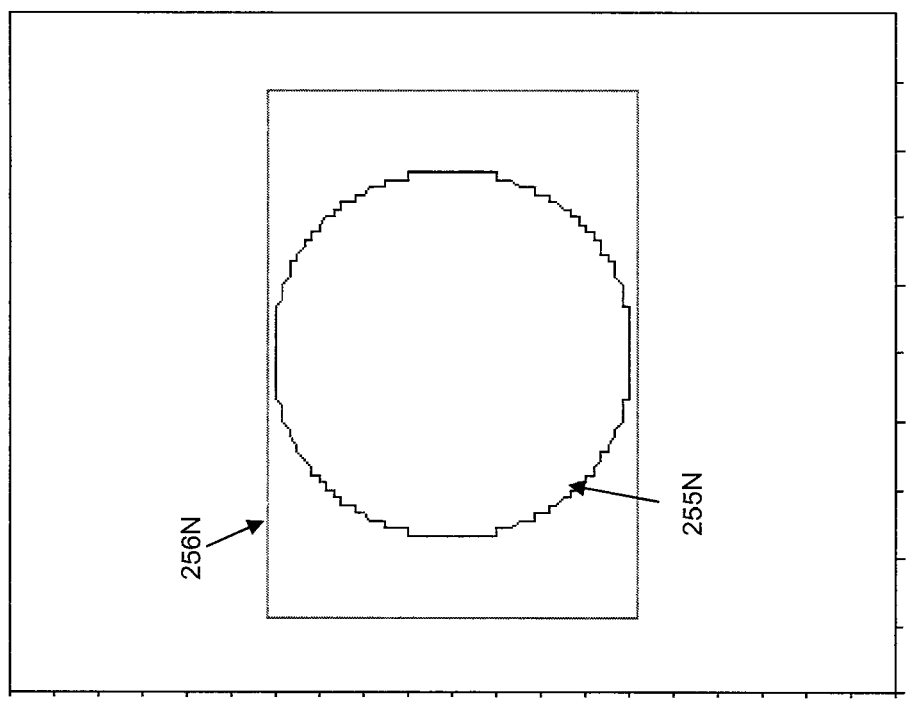
Figure 2Q:
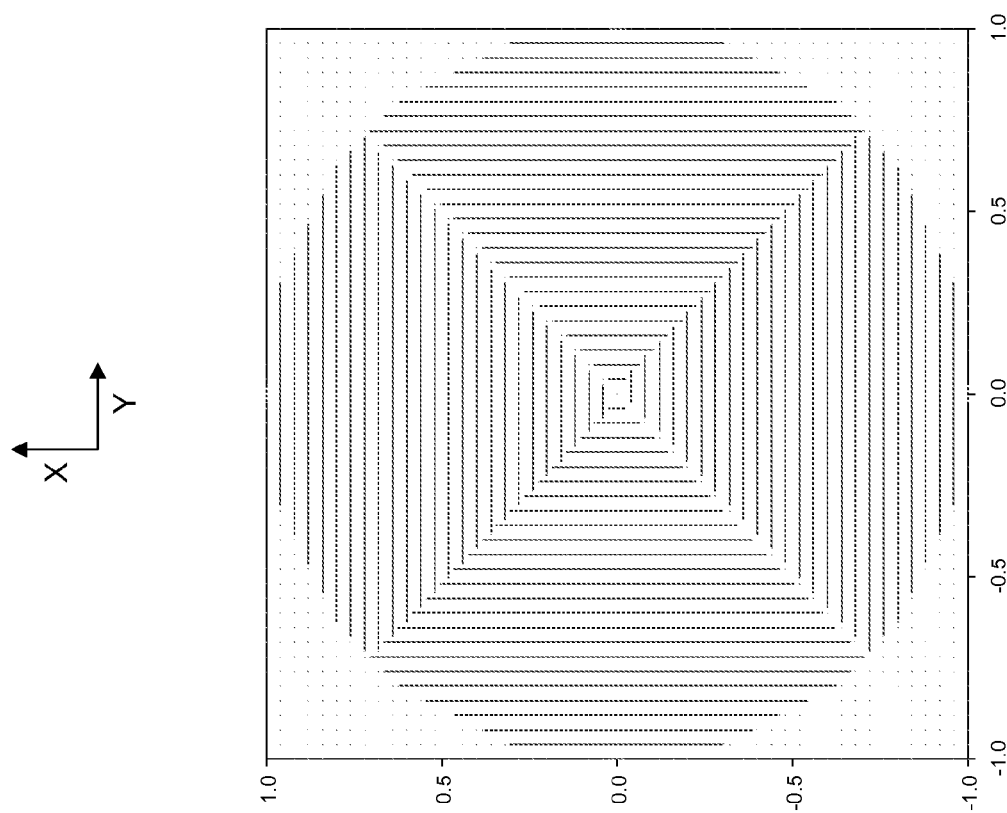

FIG. 2I shows a Z-cut at a fixed intensity threshold, and FIGS. 2J and K show image intensity graphs along X and Y-cuts respectively to comparatively demonstrate that non-traditional TM/TE and diagonal polarizations offer better imaging results for a 55 nm×100 nm rectangular hole 250 (surrounded by a mask aperture 252) on a 110 nm×200 nm rectangular grid, as shown in FIG. 2H, where $k_1=0.385\times0.7$.

From FIGS. 2I-K, it appears TM/TE polarization gives the best overall results with diagonal polarization having second best results overall. TM polarization appears to have about the same overall results as unpolarized radiation.

Polarization Condition Determination

As discussed further herein, predefined polarization conditions, such as those described above, may comprise a starting point in polarization optimization that involves locally fine-tuning the polarization of bright illumination points of an illumination intensity map. In a software simulation of lithographic response, the non-traditional polarizations may be included in an input suite available to the lithographer to explore polarization optimization.

It is to be noted that the relative advantages offered by the non-traditional polarizations depend on pattern design and OPC methods also, because both the polarization condition and the OPC depend on resulting diffraction patterns. For two dimensional patterns, the mask aspect ratio of the various features influence the diffraction pattern, and polarization of illumination affects the mask aspect ratio. Having flexibility in selecting the type of polarization may simplify the OPC process, or can even make OPC redundant. TM/TE polarization can greatly reduce the need for an OPC process for certain lithographic problems. FIG. 2P shows interaction of polarization optimization and OPC by tabulating and comparing the mask aspect ratio and NILS values in X and Y directions as shown in Table 260 for unpolarized radiation, TM polarization, diagonal polarization, TM/TE polarization and X+Y polarization. In this simulation, 50 nm square holes arranged in a 90 nm×120 nm rectangular grid were used at k1=0.315×0.42 at NA=1.35. FIGS. 2L-O show simulated Z cut imaging results using TM, polarization, TM/TE polarization, diagonal polarization and X+Y polarization respectively using these conditions. For this specific condition, TM polarization requires the least OPC, i.e. mask aspect ratio roughly matches the target feature aspect ratio. TM/TE is not the best polarization here, though TM/TE offers better results than standard X+Y polarization. In FIGS. 2L-O, 255L-O are the images of contact holes, and 256L-O are the exposure apertures.

For a rectangular grid where the holes have a 1:1 duty cycle (i.e., for a 120 nm×90 nm pitch grid, the hole target would be 60 nm×45 nm), with illumination from the resonant angle, TM/TE may require no OPC. The special case of a square grid, puts the resonant illumination on the diagonal and so in that case, TM/TE is the same as TM. In the example shown in FIG. 2H, the hole target does not have a 1:1 duty cycle, so the effect of resonant illumination is smeared.

Types of Test Patterns and Patterning Devices

To facilitate polarization condition determination, various types of test patterns and/or patterning devices may be used. For example, a typical lithography pattern of a patterning device is likely to have various types of 2-dimensional patterns in its layout. Portions of the mask layout contain one or more critical features, a high-fidelity reproduction of which is a benchmark of a lithography process. Before actual lithography using an actual pattern, simulation may be performed using one or more test patterns that emulate the one or more critical features. Such test patterns may be used to determine a desired polarization condition.

Several types of 2-dimensional test patterns may be used in such simulation to determine a desired polarization condition. FIG. 3 shows example rectangular grids of contact holes with varying pitch, that may be used as test patterns. Each of the holes are 50 nm×50 nm square. Other cross sectional shapes of the contact holes are possible, and instead of contact holes, metal contact pads may be used. A pitch can be varied only along one Cartesian axis, as shown in pattern 302 (having a grid layout of 110 nm×110 nm and k1 value of 0.385) transitioning to pattern 304 (having a grid layout of 190 nm×110 nm and k1 value of 0.66×0.385), or along both Cartesian axes, as shown in pattern 302 transitioning to pattern 303 (having a grid layout of 190 nm×190 nm and k1 value of 0.66). Note that imaging is more challenging for the lower $k_1$ values, for example, in pattern 302. Binary mask, PSM (e.g., 6% Att-PSM), or any other type of patterning device may be used. Pitch may be varied from 110 nm to 190 nm in 20 nm increments. Thus, all x,y rectangular array combinations from 110 nm to 190 nm pitch in 20 nm increments may be examined. A rectangular grid is also referred to as a Manhattan grid. A special case of a rectangular grid is a square grid. Note that all k1 values quoted here assume the pattern is printed with a scanning lithographic apparatus using a 1.35 NA projection system and 193 nm radiation.

Another example for a 2-D test pattern is a staggered grid, as shown in FIG. 4, having the holes arranged in a staggered fashion. Here also, the pitch may be varied in one or more Cartesian directions. In the FIG. 4 example, 50 nm×50 nm holes are arranged in 110 nm×110 nm at the far left and the pitch is increased by 20 nm increments in the x,y directions for each grid to the right up to a 190 nm×190 nm grid on the far right.

Other possibilities of test pattern variation include pitch variation in a radial direction, aspect ratio variation of the contact holes/contact pads, overlay variation of two layers, etc.

Figure 5B:
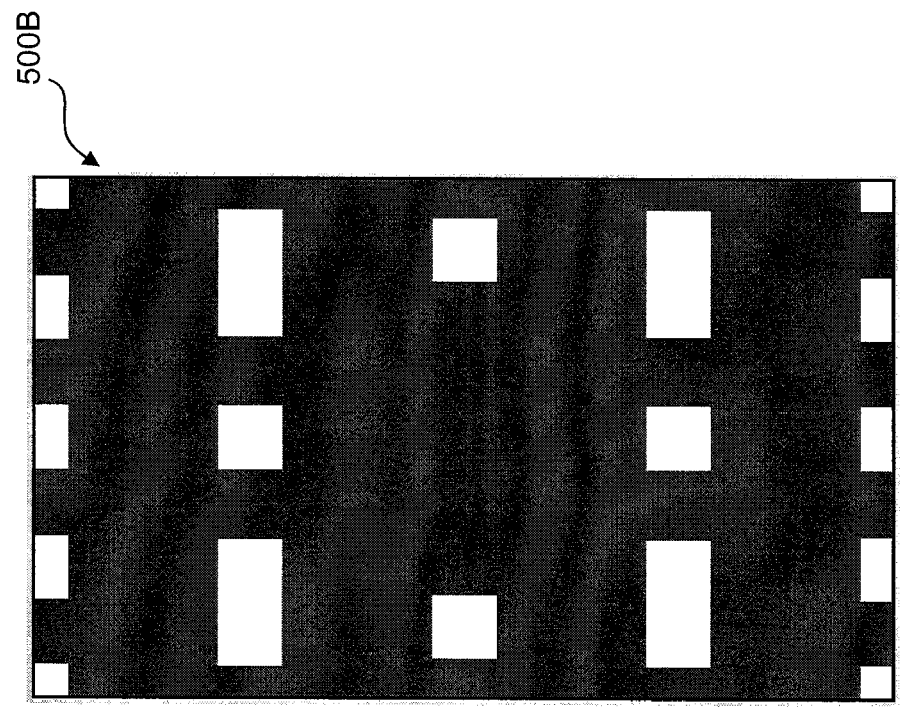
Figure 5A:
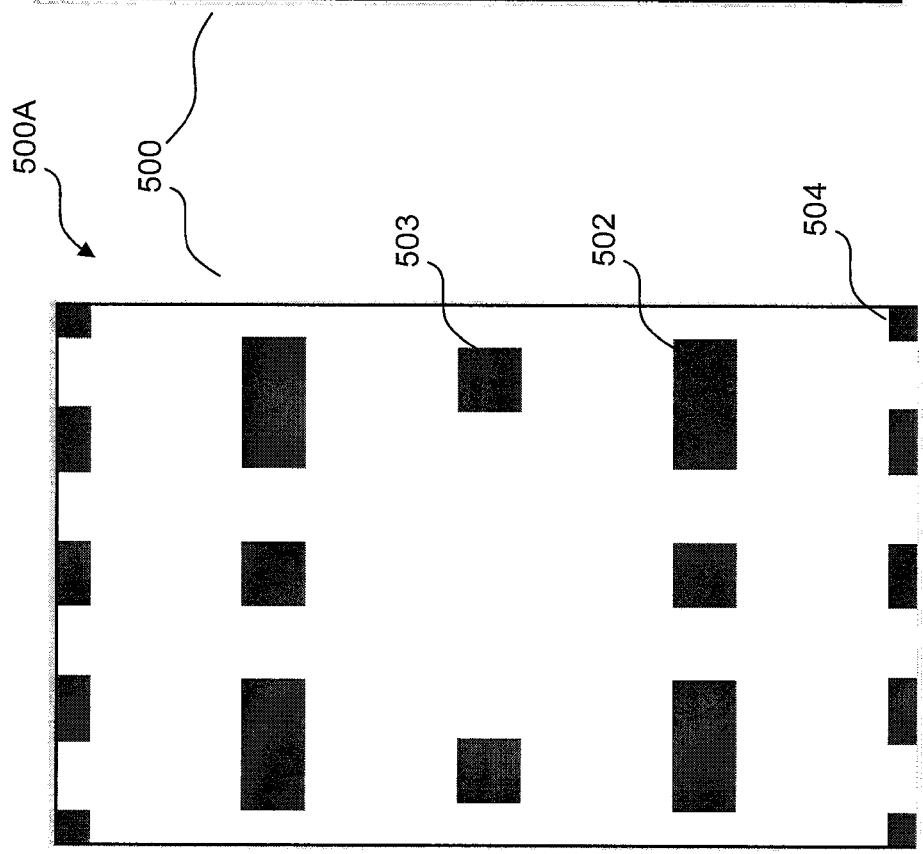

Additionally, modern IC circuitry often has more complex (often somewhat periodic) 2-D patterns than a simple array. An example of this is shown in FIGS. 5A-B. Various features 502, 503, 504 in the pattern 500 may be of different dimension, and have different pitches. Pattern 500 may be seen in a modern SRAM circuit. Patterns can be represented by dark patches in a bright field (mask 500A of FIG. 5A), or bright patches in a dark field (mask 500B in FIG. 5B) depending on the tone of the resist process. Such a pattern often represents a significant target for device manufacturing and therefore is a good test case for simulation.

Finite length dense line patterns and/or patterns of irregular polygonal shapes may be emulated if the actual circuitry has those patterns, and if a critical feature involves those patterns.

During simulation, one or more cutlines on or in between the test features are placed to define a number of distinct simulation points within a selected simulation cell.

Spatial Illumination Mapping

Figure 6A:
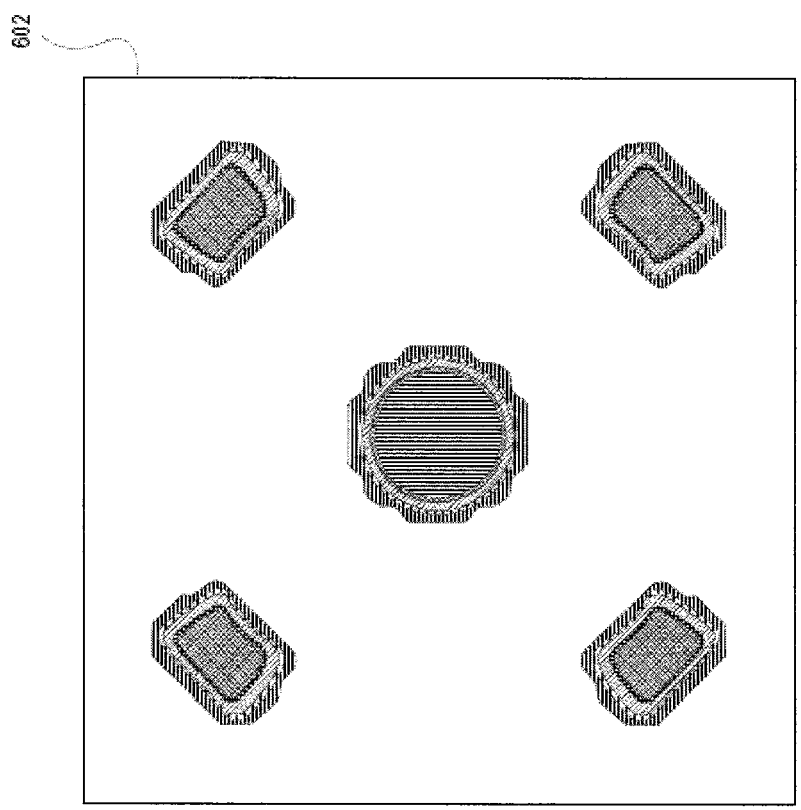
FIG. 6A-C show spatial mapping of three different off-axis illuminations used in embodiments of the invention.
Figure 6B:
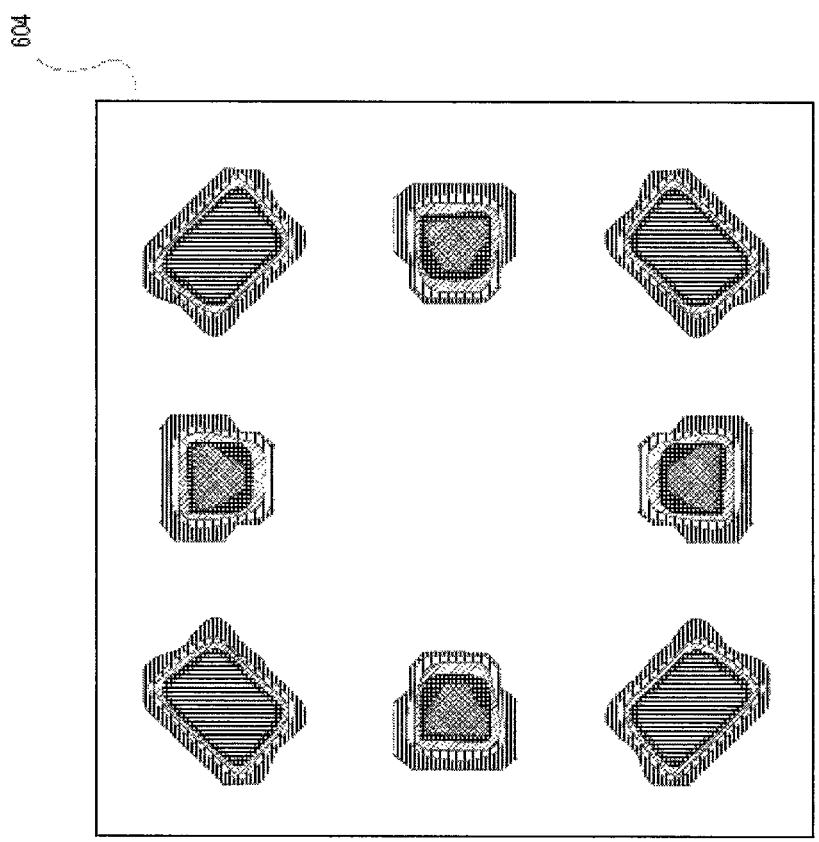
Figure 6C:
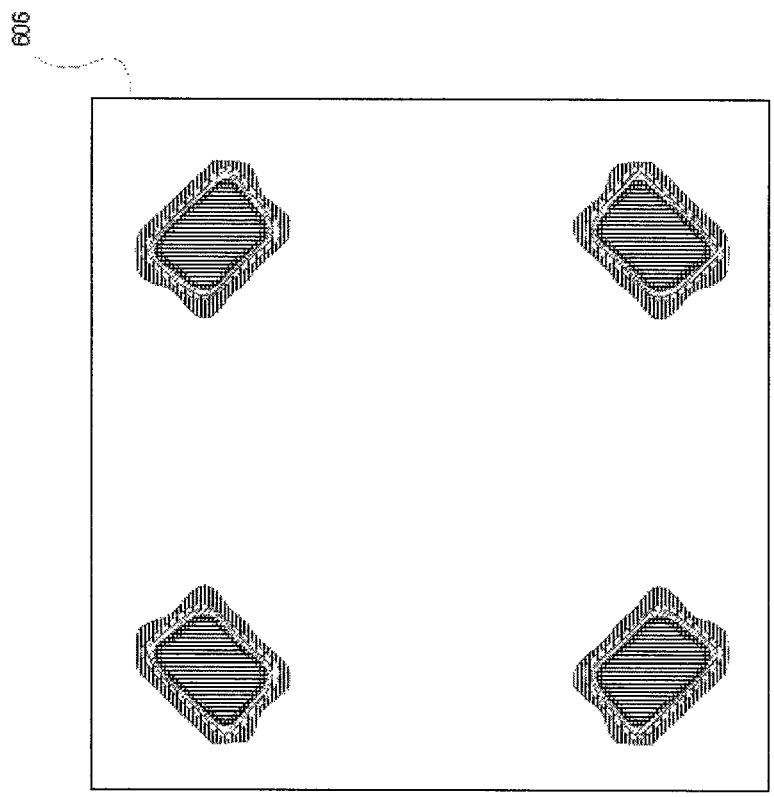

To facilitate polarization condition determination, various spatial illumination distributions may be used. FIG. 6A-C illustrate examples of off-axis illumination and in these example, the spatial intensity maps of the illumination show distinct and often isolated localized high-intensity regions. FIG. 6A-C show spatial mapping of three different off-axis illuminations 602, 604, and 606, having 5 poles, 8 poles, and 4 poles (quadrupole) respectively. Annular illumination, dipole illumination, CQuad illumination, etc. are further examples of off-axis illumination. Conventional beam shaping elements may be used to create the off-axis illumination. Off-axis illumination is one of the imaging enhancements used for high-resolution lithography.

It is possible to apply a polarization condition uniformly to all the bright illumination points in the spatial intensity map of the illumination coming from the radiation system. For example, each bright illumination point in the spatial intensity maps in FIG. 6A-C may be produced with one of unpolarized illumination, TM-polarized illumination, TE-polarized illumination, etc.

As will be seen in greater detail in FIGS. 13-15, during polarization determination, the spatial intensity map is divided into individual pixels or pixel groups. These groups may be called polarization pixel groups. Fine-tuning of the polarization condition involves conditioning the polarization of each of the polarization pixel groups to come up with a free-form polarization condition that results in the best or desired lithographic response. During simulation, physical coordinates of the polarization pixel groups within the beam aperture are stored in an input file that is used by the simulator. The term 'polarization pixel group' is just a nomenclature chosen mainly for use in the simulation domain to indicate portions of an illumination source map where polarization conditions are predefinable. In terms of actual hardware of a lithographic apparatus, an equivalent term may be a "source pixel group", i.e. an area on the source pupil where polarization condition is predefinable by a mirror array coupled to the source, where polarization controlling elements are coupled to the mirror array. By mechanically controlling positions of the physical mirrors using the polarization controlling elements, a source pixel group with a predefined polarization condition can be realized on a source pupil plane.

Polarization Condition Production

In an actual lithography tool, one or more physical optical elements, such as a quartz or glass plate with a spatially composite structure, may be manufactured and used in conjunction with the other optical elements of the radiation system to implement the non-traditional polarization conditions. The illumination may be inherently polarized in the particular manner of the polarization conditions or may be unpolarized radiation that is converted, if applicable, to the particular desired polarization. One or more optical elements, such as a polarizing crystal, may be used to selectively polarize the illumination For example, the desired polarization can be produced by an appropriately designed diffractive, refractive or reflective optical element having polarization changing attributes therein or associated therewith (e.g., a transmissive polarization plate). In an embodiment, the illumination shape and the desired polarization can be produced by the same optical element.

Further, it may be possible to apply a different polarization to different bright illumination points. To accomplish that, the spatial intensity distribution of the illumination may be, for example, created by or transferred by a spatial light modulator (e.g., a mirror array) which may selectively apply different polarizations to different portions of the spatial intensity distribution (e.g. by causing radiation to pass through different polarization optics or different parts of a polarization optic and/or appropriately polarizing radiation incident on a spatial light modulator and then producing the desired polarization and/or illumination shape via allocation of modulated elements). For example, each of the poles in FIG. 6A-C may have a different polarization or even within a pole in FIG. 6A-C the polarization may be spatially varied. When a fixed polarization field or design is applied, the polarization angles of the individual poles may vary (depending on angle) in a known way. Co-pending co-owned U.S. provisional application No. 61/329,371, filed Apr. 29, 2010, titled, "Illumination System and Lithographic Apparatus" describes some details of an embodiment of physical hardware to implement such polarization control.

Performance Metric

To facilitate polarization condition determination, a performance metric may be used. The performance metric tracks the variation of the values obtained for a lithographic response when process parameters are varied within a process budget. The lithographic response in the performance metric includes one or more selected from: critical linewidth non-uniformity, critical dimension error, aspect ratio error, pitch error, side edge placement error, corner edge placement error, mask error enhancement factor (MEEF), dose latitude, depth of focus, process window, or various combinations thereof. The process parameters include one or more selected from: focus, exposure dose, exposure wavelength, patterning device attenuation, patterning device bias, numerical aperture of the radiation system, shape of a radiation source, or field type of the patterning device. Other types of lithographic responses and process parameters may be used too without limiting the scope of the invention.

It is not required to vary all of the process parameters. For example, if a certain type of mask (e.g., 6% Att-PSM) works best for certain test features, then that parameter may be kept constant to reduce computational load during the simulation. In another similar example, if a bright field mask works better for certain test features, then the need for using a dark field mask may be precluded.

The performance metric is updated during simulation as the targeted lithographic response converges towards a particular target value. The target value may be a maximum value (for example, maximum NILS value), or a minimum value (for example, minimum critical dimension error value). The current value of the lithographic response is stored for each iteration, and the process parameters corresponding to the current best lithographic response is applied to the next round of simulation to see if better values are obtained. The simulation may be terminated when a favorable value of the lithographic response is obtained, which may be short of the difficult-to-find "best" or "optimum" value.

During the iterative simulation, an improved polarization condition is associated with a particular predefined metric value. The desirable imaging results can be tuned according to a practically achievable process latitude.

Polarization Optimization Process Flow

Figure 7:
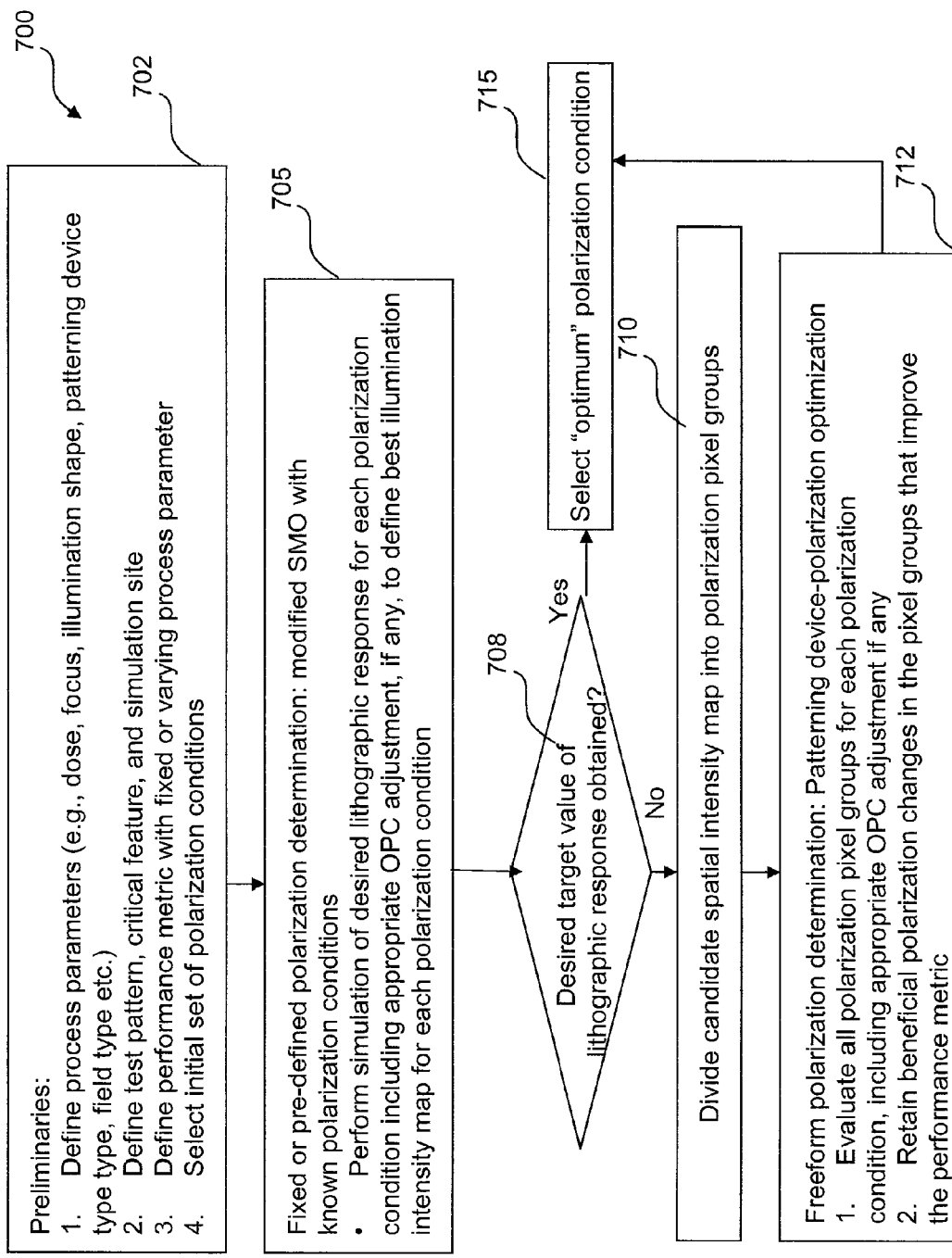
FIG. 7 shows a flowchart 700, showing an example process flow of the polarization condition determination process, according to an embodiment of the invention.

As shown in the flowchart 700 of FIG. 7, polarization determination can be done in two main processes. Process 705 may be seen as a modified SMO process using a set of fixed or predefined polarization conditions. This process may be enough to generate a satisfactory lithographic response. If not, then results of process 705 are used to perform a subsequent freeform polarization determination process 712. In an embodiment, either process 705 or process 712 may be performed alone, i.e., process 712 need not be performed before or after process 705 nor does process 705 need to be performed before or after process 712.

Before process 705, some preliminaries (collectively called step 702) are performed or obtained to set up the simulation. Various process parameters are selected, such as illumination shape, dose, patterning device type, focus setting, field type, etc. Also, one or more test patterns are selected, one or more critical features in the test pattern are identified, and simulations points or cutlines are defined in the test pattern. A performance metric is defined, in which one or more of the process parameters may be constant, and one or more of the other process parameters are varied within a process error budget. The lithographic response value to be tracked may be a CD error, an edge placement error or other parameter as discussed before.

Additionally, an initial set of candidate predefined polarization conditions are selected. The predefined polarization conditions may include a fixed polarization definition applied to the entire pupil plane (e.g., unpolarized radiation, X+Y polarization, TE polarization, TM polarization, or TM/TE polarization). The initial polarization definition may be limited to specific fixed polarization angles. The angles are dictated by the hardware implementation. For example, fixed angle polarization plates can be used at a mirror array that controls source beam patterning (a commercial example of which is the Flexray™ illuminator by ASML). A lithographer can develop an insight into the most effective initial set of predefined polarization conditions. In an illustrative non-limiting example, for σ values above 0.5, the initial set of polarization conditions may include TM, Y+X, Y and X polarization conditions, and for σ values below 0.5, the initial set of polarization conditions may include TM/TE, TE, and X+Y polarization conditions. Experience-based selection of the initial set of polarization conditions helps in reducing the computational load during the simulation.

Once the preliminary conditions are set up, in an embodiment, the fixed or pre-defined polarization condition determination process 705 is performed. In this process, the lithographic response is calculated for all the initially defined cutlines for known best process parameters. An initial OPC adjustment process may be performed (which may be a full-fledged OPC or a simplified OPC) to adjust the placement of feature edges when the lithographic response value converges substantially to the desired value (e.g., max CD error <0.05 nm). Thereafter, the lithographic response value is calculated for the budgeted error of the process parameters. For example, CD error may be tracked for a focus range, dose range, patterning device attenuation range, etc. Patterning device bias may be applied to all test features simultaneously. Individual CD error values may be grouped to find a CD uniformity (CDU) value, and the metric may be set to locate the most favorable CDU value rather than CD error value. Of course, there are a great many possibilities that can be the chosen as the ultimate lithographic response to be tracked by the performance metric. During the successive iterations of the simulation, appropriate OPC adjustment may be performed in parallel to assist the convergence of the simulation.

Although process 705 (modified SMO process) may encompass a variety of performance tracking possibilities as discussed herein, in an embodiment, process 705 performs a polarization condition determination process corresponding to each of the initial predefined polarization conditions. To do that, a respective spatial intensity map of the illumination for each of the polarization conditions in the initial set is determined to arrive at an optimum or improved spatial intensity map for each of the polarization conditions. In the modified SMO process, using the process parameters and the respective initial predefined polarization conditions, a simulation of the desired lithographic response for each predefined polarization condition including appropriate OPC adjustment, if any, is performed to determine the lithographic response.

Depending on the target lithographic response value to be achieved, process 705 may be sufficient (without further polarization fine-tuning) to identify a beneficial or optimized polarization condition (step 715), as determined at the decision block 708. For example, it may be determined that for a dark field illumination with σ>1, the initial predefined polarization condition Y+X provides optimum or beneficial lithographic response. In other words, one of the initial set of predefined polarization conditions may satisfy the lithographic requirement in certain cases, especially for lithographic problems with relatively higher $k_1$ values.

However, if the desired lithographic response is not achieved in process 705, then one or more predefined polarization conditions may be selected based on the most promising results of process 705. The most promising results of the process 705 may be the polarization conditions associated with the best performance metric. In step 710, polarization pixel groups are identified prior to the process 712.

In the process 712, freeform polarization fine-tuning is performed. As will be discussed in detail with respect to FIGS. 13-17, in the freeform polarization fine-tuning, each of the individual pixels or pixel groups are subjected to an application of one or more of the polarization conditions in the initial set of predefined polarization conditions discussed above (e.g., the one or more predefined polarization conditions may be selected based on the most promising results of process 705), and possibly various other types of predefined polarization conditions. In other words, step 712 may accommodate increased polarization selection granularity. Standard numerical optimization techniques are applied to find improvement in lithographic performance when the polarization condition is varying. Sequential pixel flip may be a first step for the optimization technique. For example, referring to FIGS. 13-14, if during process 705, it is determined that TM/TE, TM and Y-polarization are the most promising polarization conditions, then at least all three of these polarization conditions are applied (sequentially or in any other standard method used in optimization) to each of the example pixel groups 1310-1313. Similar to the process 705, lithographic response is tracked when the polarization condition is perturbed locally at a pixel group or at an individual pixel level. This method is referred to as "pixel flip." Single pixel flip or pair-wise pixel flip within a group may be attempted. With each step of pixel flip, the initial condition is redefined with the current best result condition. A linear sensitivity analysis method may be used to rank the beneficial changes that improve the final lithographic response. It is also possible to drastically change the initial condition by "randomly" flipping a relatively larger percentage of pixels (e.g., 10% of the pixels), and start the iterative optimization process afresh. Standard numerical techniques may be used for the optimization. Again, appropriate OPC and process parameter adjustment may be applied in parallel to get to the best combined result. Process 712 can be called a combined patterning device-polarization optimization process.

Example Results of Polarization Optimization

FIGS. 8-12 illustrate specific examples where the techniques described herein have been applied to get improved polarization conditions. Specifically, FIGS. 8-12 show results of process 705 described in FIG. 7.

Figure 8:
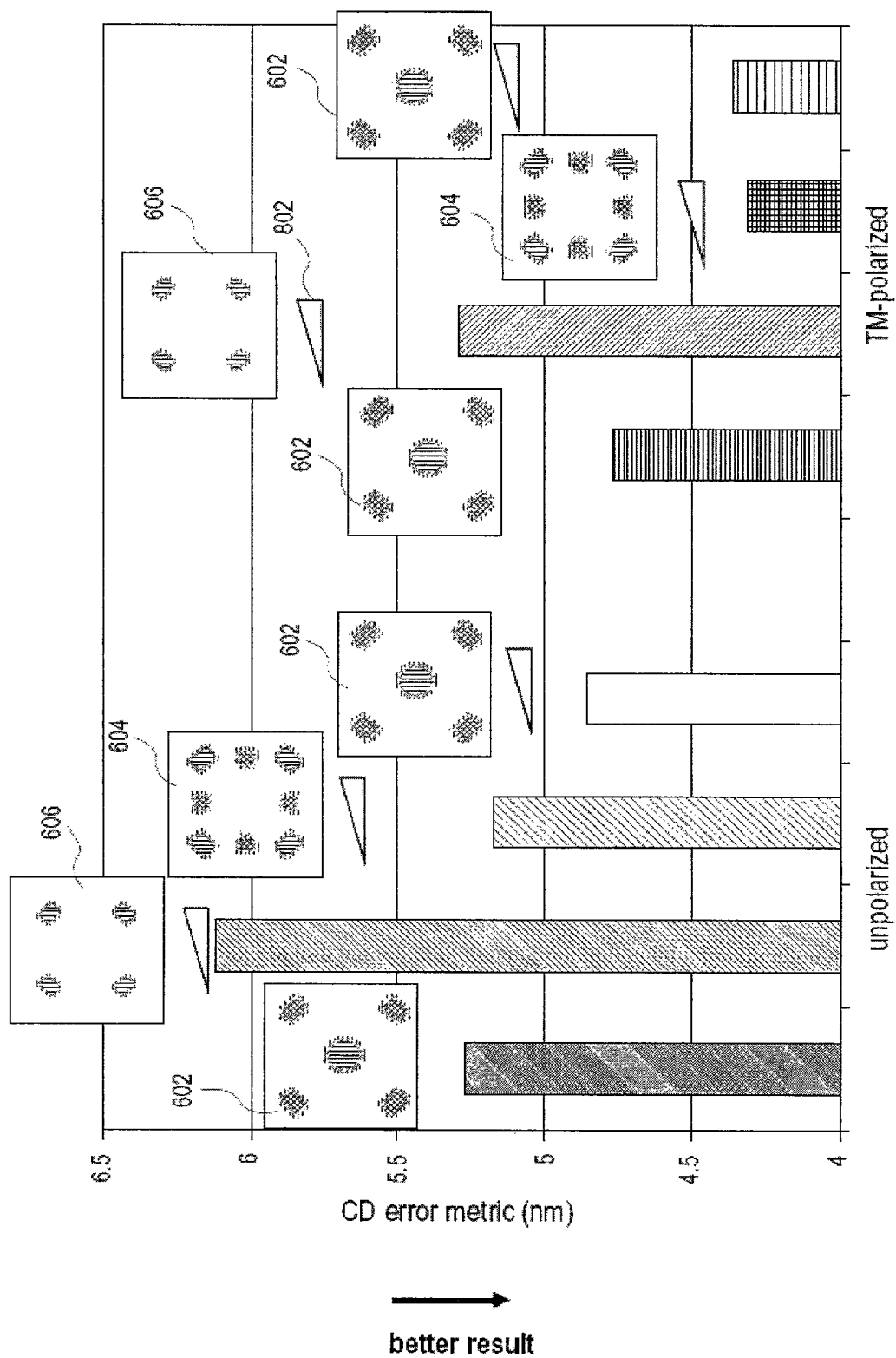
FIGS. 8-12 show various examples of metric results obtainable by embodiments of the invention.

FIG. 8 shows some example the results corresponding to the Manhattan square grid example of FIG. 3 with varying pitch (min k1=0.385, corresponding to the min. pitch 110 nm), using the off-axis illumination conditions 602, 604, and 606 described in FIG. 6. A 6% Att-PSM mask was used with NA=1.35. The pitch of the grid of 50 nm holes was varied equally by 20 nm increments from grid 302 having 110 nm×110 nm pitch to grid 303 having 190 nm×190 nm pitch. Additionally, a fixed focus ramp 802 is used in some cases (e.g., a 5-pole illumination 602 is used both with and without a fixed focus ramp). For each of the four indicated cases (Quasar, 8-pole, 5-pole and 5-pole without focus ramp), parametric SMO was conducted with multiple polarization states. The tracked lithographic response in the performance metric is a predefined CD error metric in nanometers. As seen in FIG. 8, the best result with unpolarized illumination is obtained for 5-pole illumination with a fixed focus ramp, and the best result with TM-polarized illumination is obtained for 8-pole illumination with a fixed focus ramp. As seen in FIG. 8, changing from unpolarized illumination to TM polarization improves the CD metric significantly (10-16%) for all comparable pole and focus ramp combinations shown.

Figure 9:
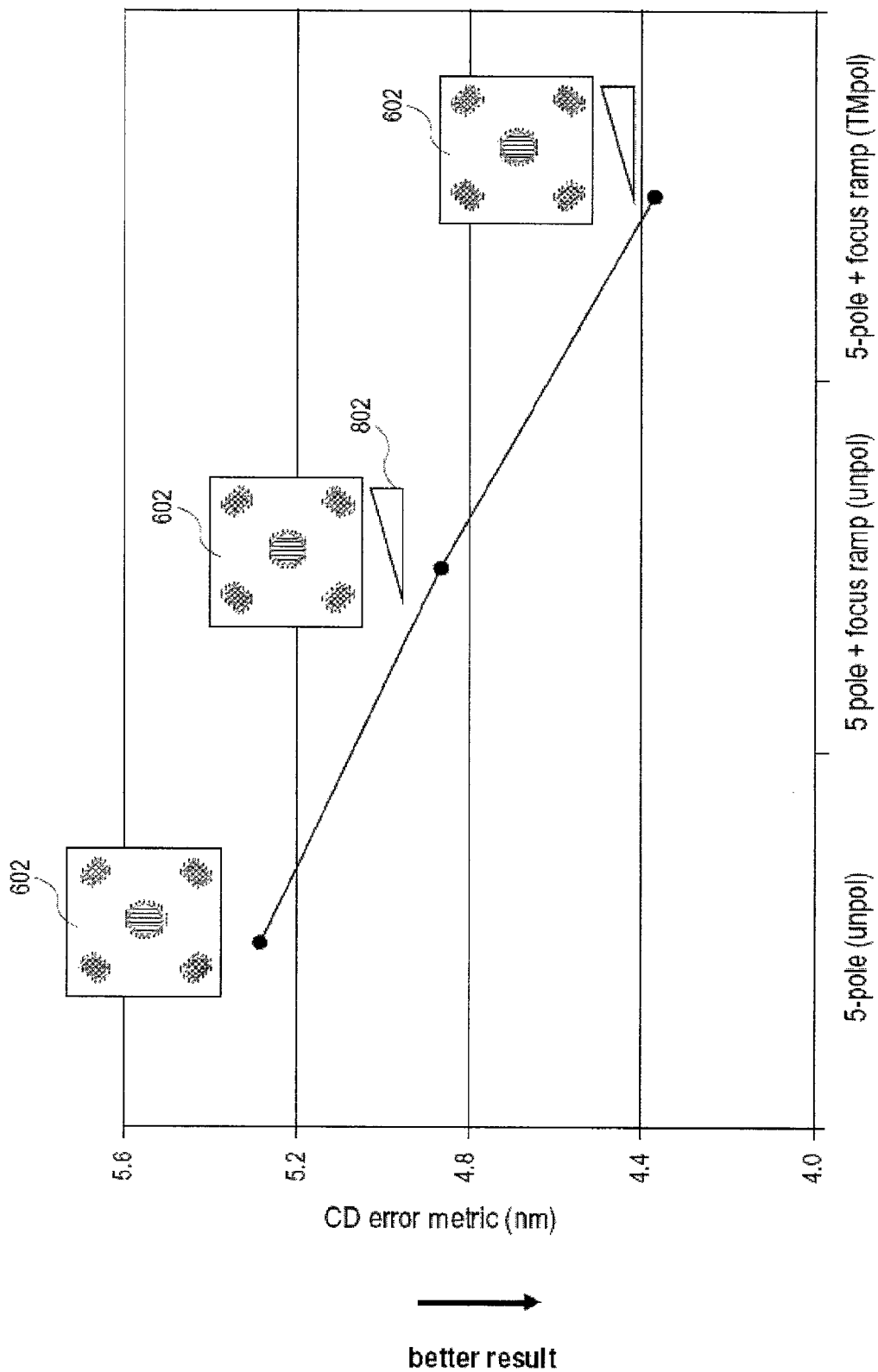

FIG. 9 shows CD improvement results for the 5-pole case so that the relative benefit of best polarization selection can be seen more clearly. The unpolarized parametric SMO (varying pole locations, intensities, patterning device global bias) result was improved by 8% by including a focus ramp. However a further 10% improvement was obtained by having TM radiation and a fixed focus ramp. The polarization selection is even more beneficial than the focus ramp.

Figure 10:
Figure 11:
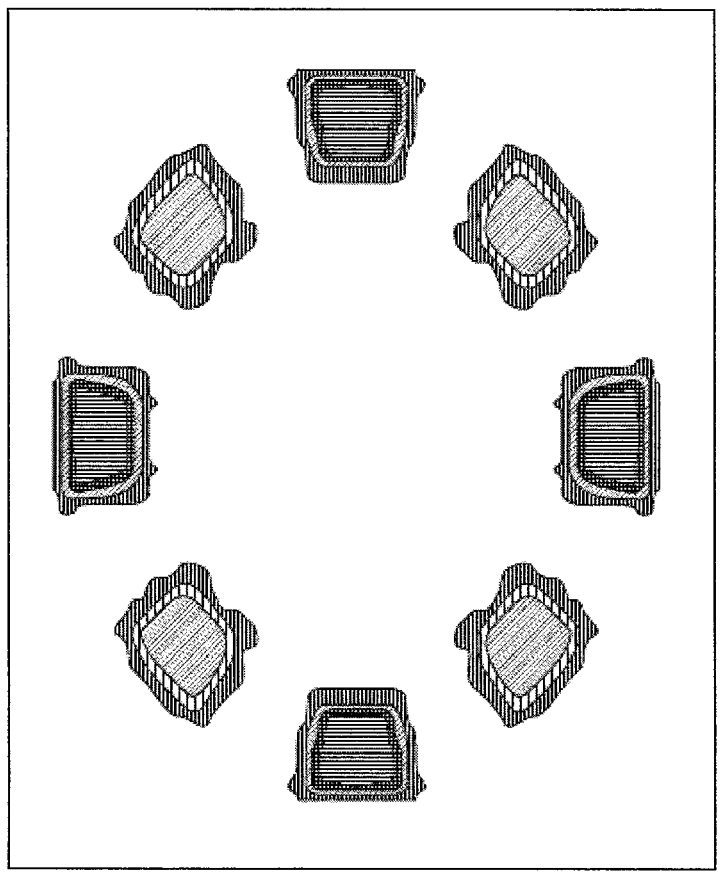

FIG. 10 shows how an improved or optimum polarization condition differs when the k1 value is lower. An example process parameter Table 1000 that tabulates the results corresponding to various process parameters shows that for a similar test pattern of Manhattan square grid with a low k value (min k1=0.33 corresponding to 95 nm pitch), the optimum polarization condition is not TM, but TM/TE with the other illumination parameters adjusted (keeping the focus ramp intact in all the conditions) as shown in the Table 1000. A 6% Att-PSM mask was used with NA=1.35. An 8-pole illumination as shown in FIG. 11, is used with a fixed focus ramp at 350 nm. The pitch of the grid of 50 nm holes was varied from 95 nm×95 nm pitch to 110 nm×110 nm pitch and then equally by 20 nm increments from grid 302 having 110 nm×110 nm pitch to grid 303 having 190 nm×190 nm pitch.

Figure 12:
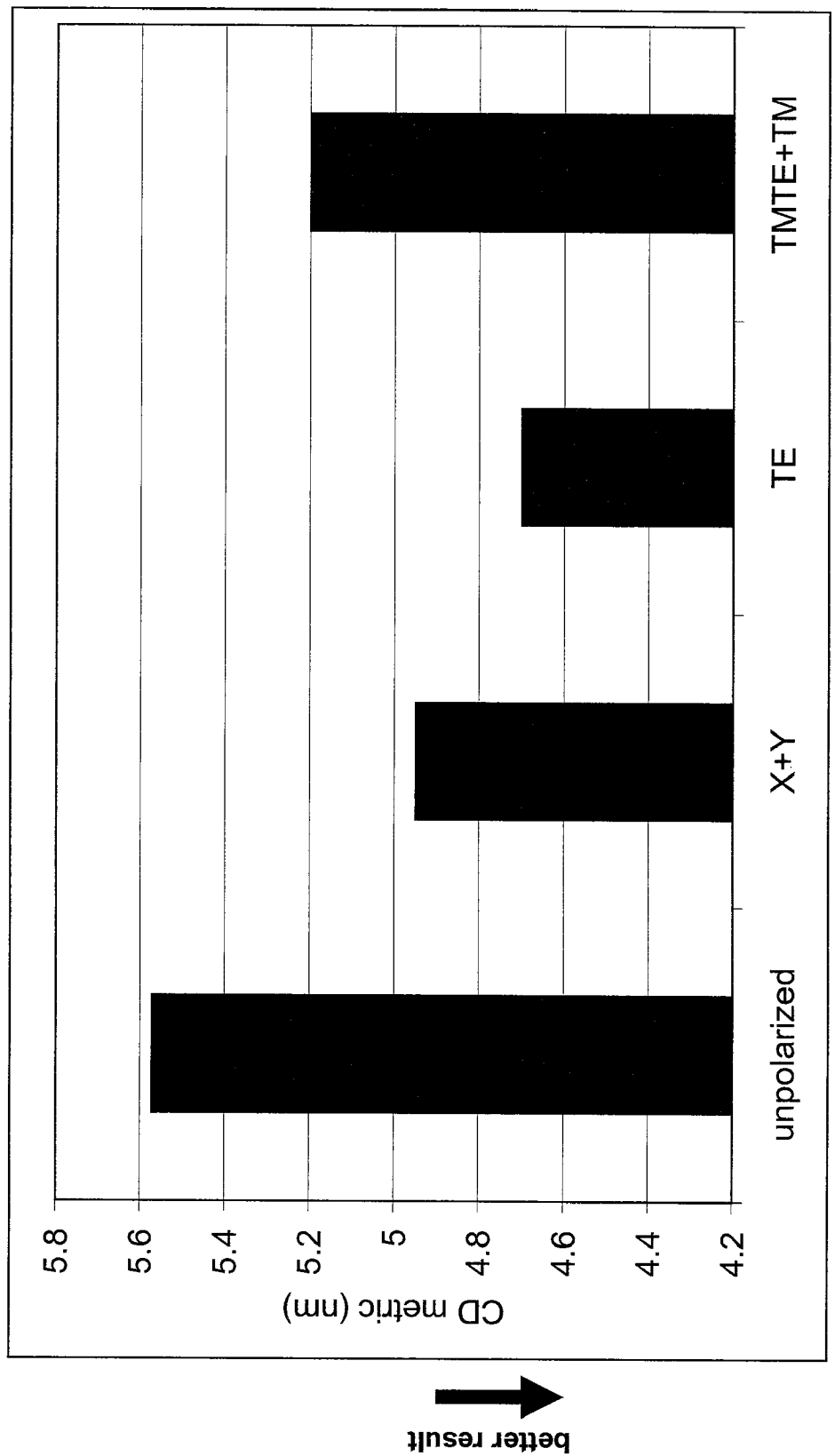

FIG. 12 considers a more complex 2-D pattern, e.g., pattern 500A in FIG. 5A, typically seen in SRAM circuits, and results from a polarization condition determination using that pattern. For a bright field, 6% Att-PSM mask with min. $k_1$=0.384, the best result is seen for TE polarization. Here, the CD metric is defined as a combination of CD uniformity and worst process corner error. The TE result is about 5% better than X+Y and about 16% better than unpolarized. Here TM/TE with a central TM polarization condition is not the best polarization condition. From simulation using the pattern 500A in FIG. 5A, a SMPO with TB-polarization may give superior imaging performance than a standard SMO with conventionally used X+Y polarization. FIG. 12 also underlines the fact that the generalizable polarization optimization scheme disclosed in the present application offers a lithographer improved flexibility in terms of choosing the actual polarization settings in hardware, in contrast to just accepting a fixed polarization condition from previous experience.

The various examples of FIGS. 8-12 illustrate that it is hard to predict an improved or optimum polarization condition, as the improved or optimum polarization depends on various process parameters and $k_1$ values. Embodiments of the invention provide avenues to get to an improved or optimum polarization in an efficient manner using systematic simulation of desired lithographic response. The examples shown in FIGS. 8-12 assume a predefined polarization condition in the pupil plane rather than fine-tuned polarization condition. However, the examples are merely illustrative, and not restrictive of the scope of the invention.

Polarization Fine Tuning at Pixel Level in Intensity Map

FIGS. 13-16 show examples of freeform polarization fine-tuning that takes place in process 712 described in FIG. 7.

Figure 13A:
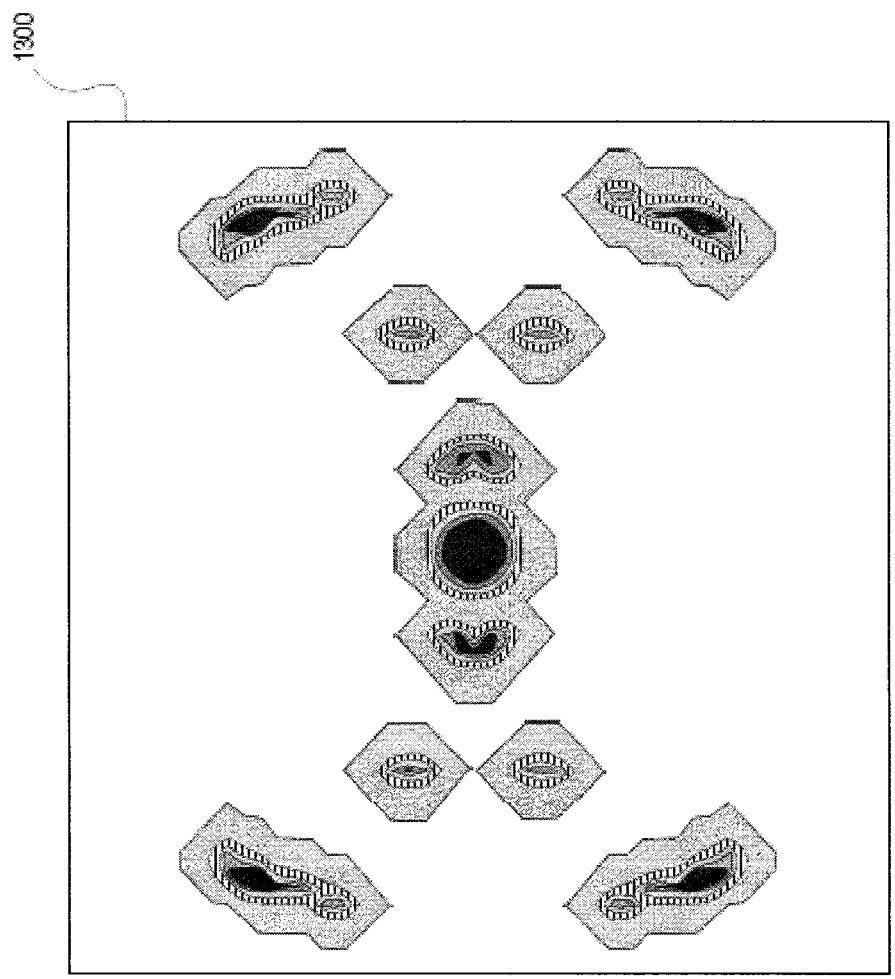
FIGS. 13-17 show examples of polarization fine tuning, according to embodiments of the invention.
Figure 13B:
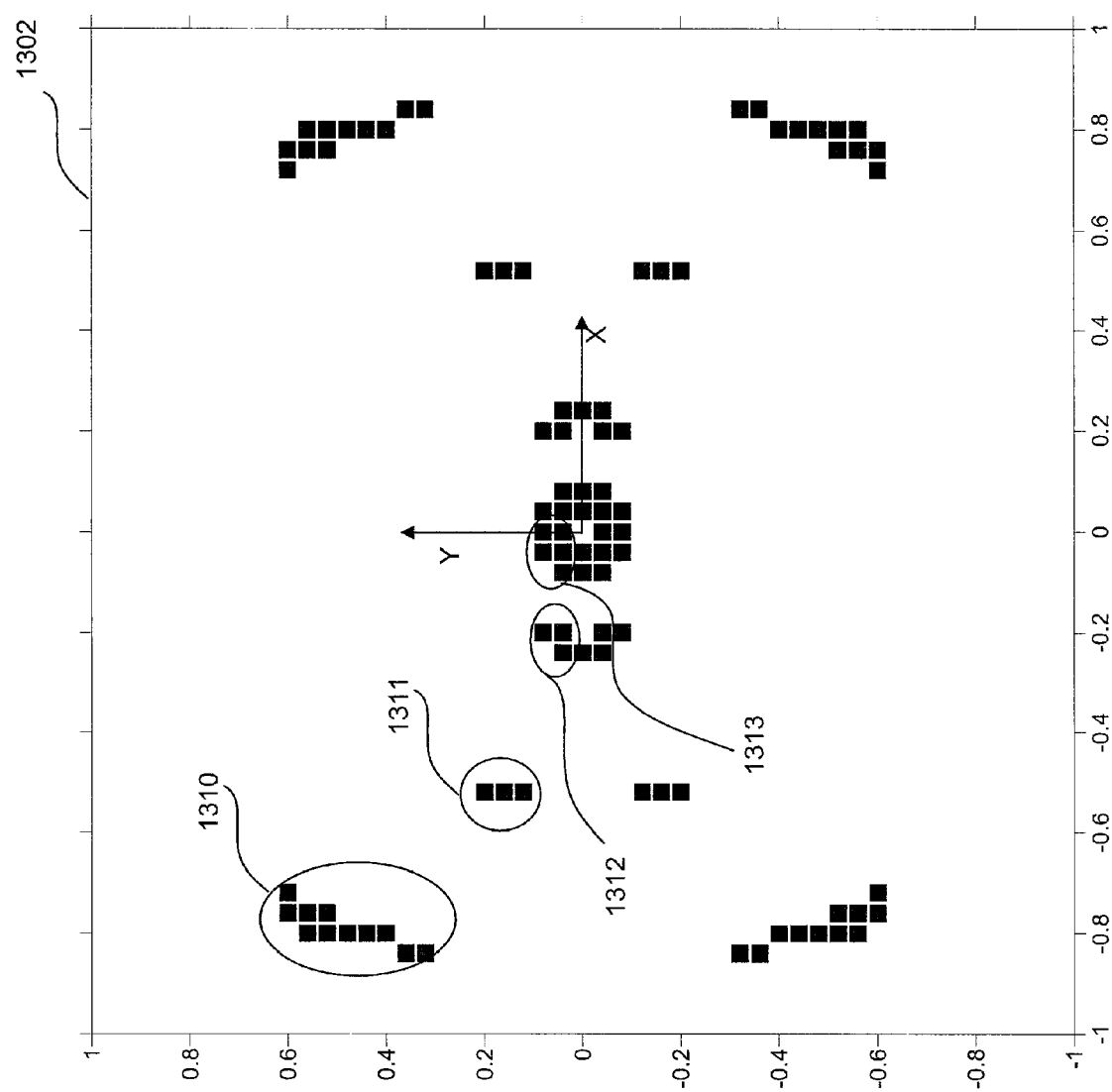
Figure 14A:
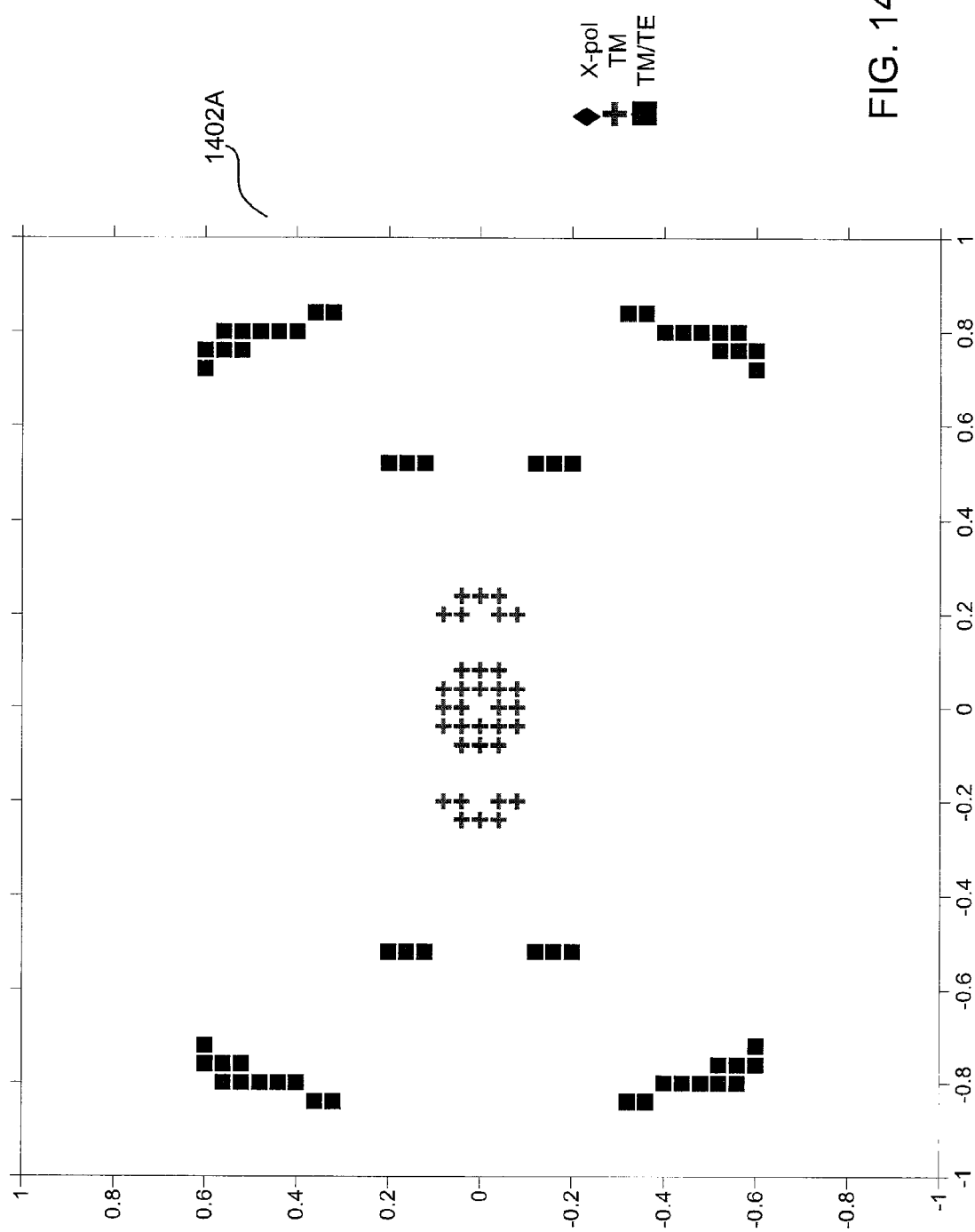
Figure 14B:
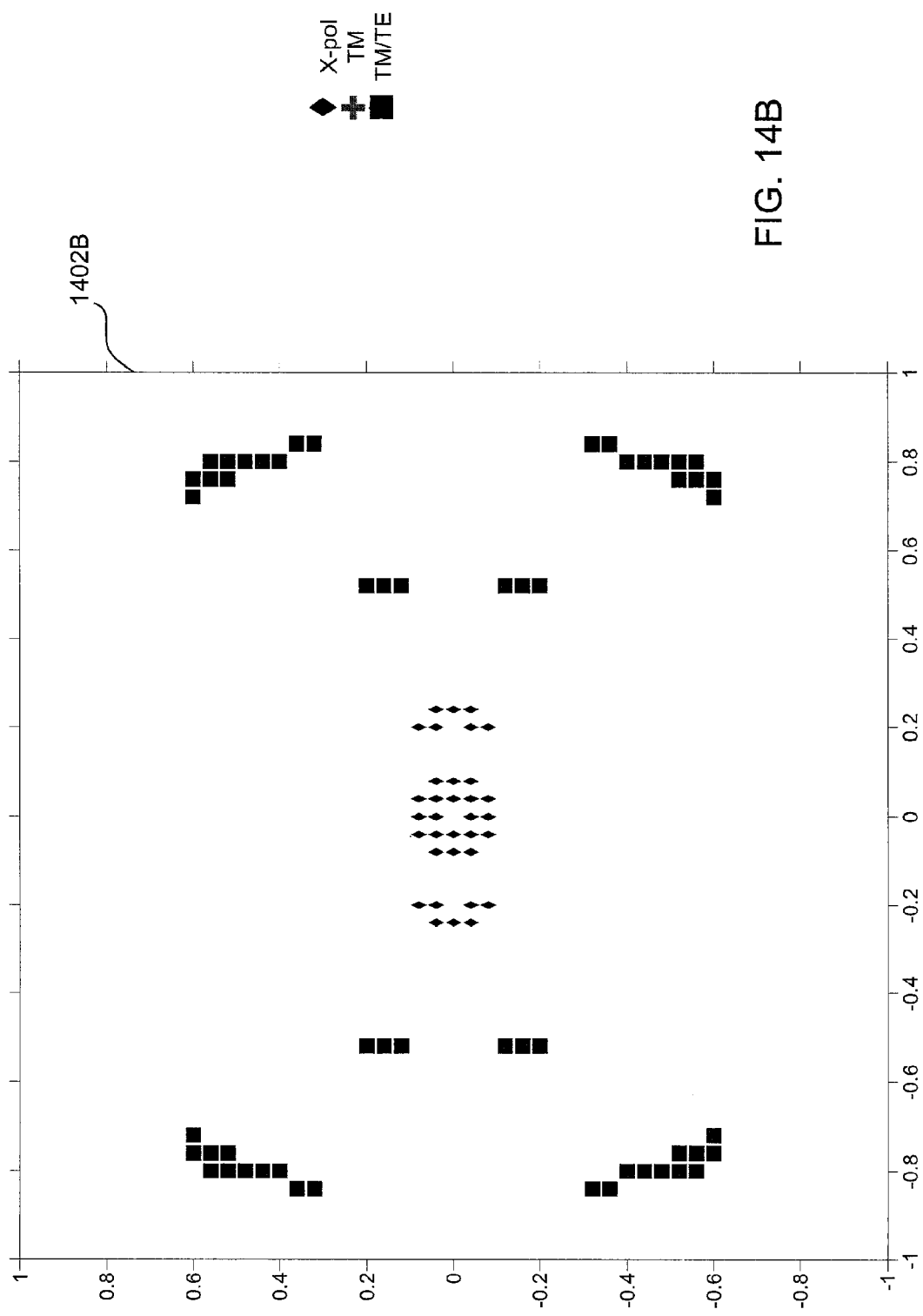

FIG. 13A-14B illustrate a case with a dark field pattern, e.g., pattern 500B in FIG. 5B, where the predefined illumination is TM/TE (similar to the predefined polarization shown in FIG. 2E). The intensity map of the illumination with the predefined polarization is shown in FIG. 13A as element 1300. Element 1302 in FIG. 13B is the spatial intensity map of 1300, with the bright points labeled as distinct polarization pixels. Adjacent polarization pixels can be grouped together in a variety of ways. For example, in 1302, pixel groups 1310, 1311, 1312 and 1313 are symmetrically repeated in all four quadrants. A predefined TM/TE polarization condition is initially applied to all the pixels. This state can be a result of process 705 that produces a CD metric of 6.1 nm. FIG. 14A-B show an intermediate and a final step in polarization fine-tuning. Changing the polarization of the pixels at the center from pure TM/TE across all the pixel groups to TM at the center pixel groups significantly improves the CD metric to 4.7 nm, as shown in intermediate map 1402A (FIG. 14A). That is the polarization is changed to TM/TE with TM at σ<0.3 at the center (similar to the predefined polarization shown in FIG. 2F). Further polarization fine-tuning by changing the center pixels to X-polarization generates the final map 1402B (FIG. 14B) corresponding to further improved CD metric value of 4.6 nm.

Figure 15A:
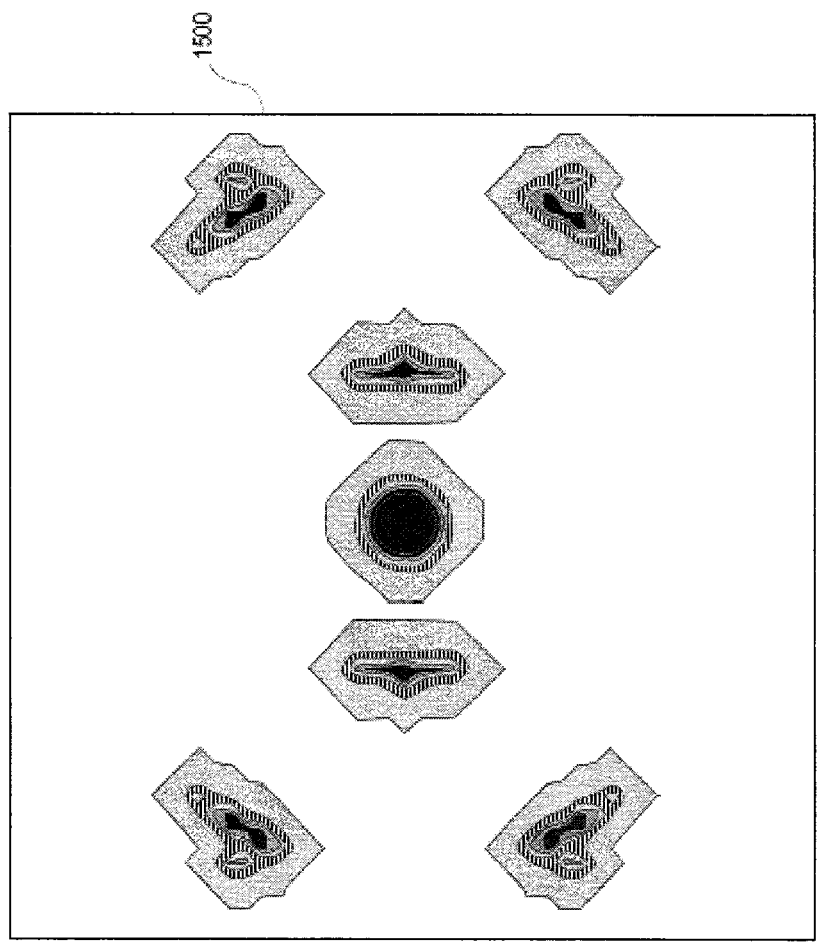
Figure 15B:
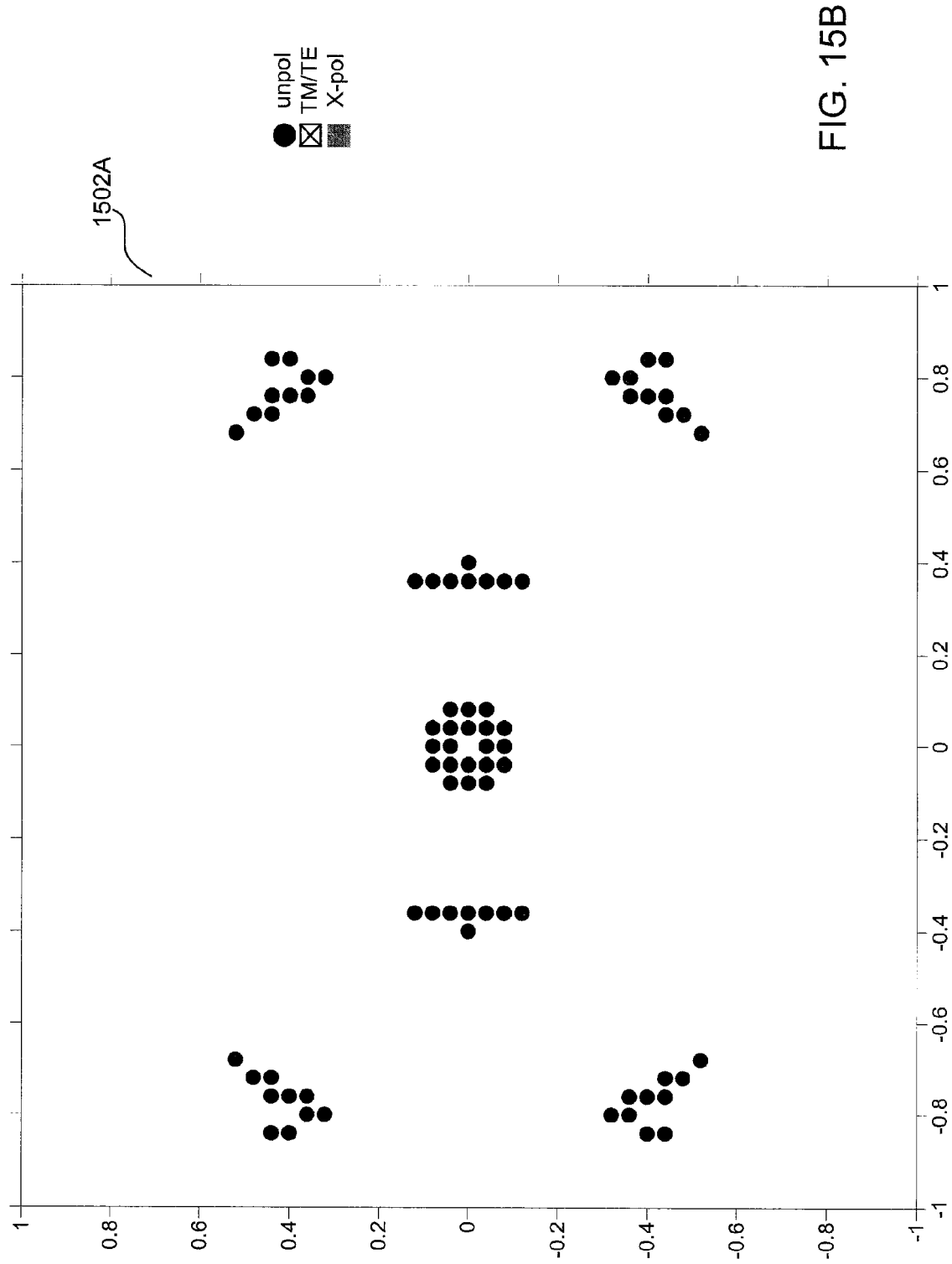
Figure 15C:
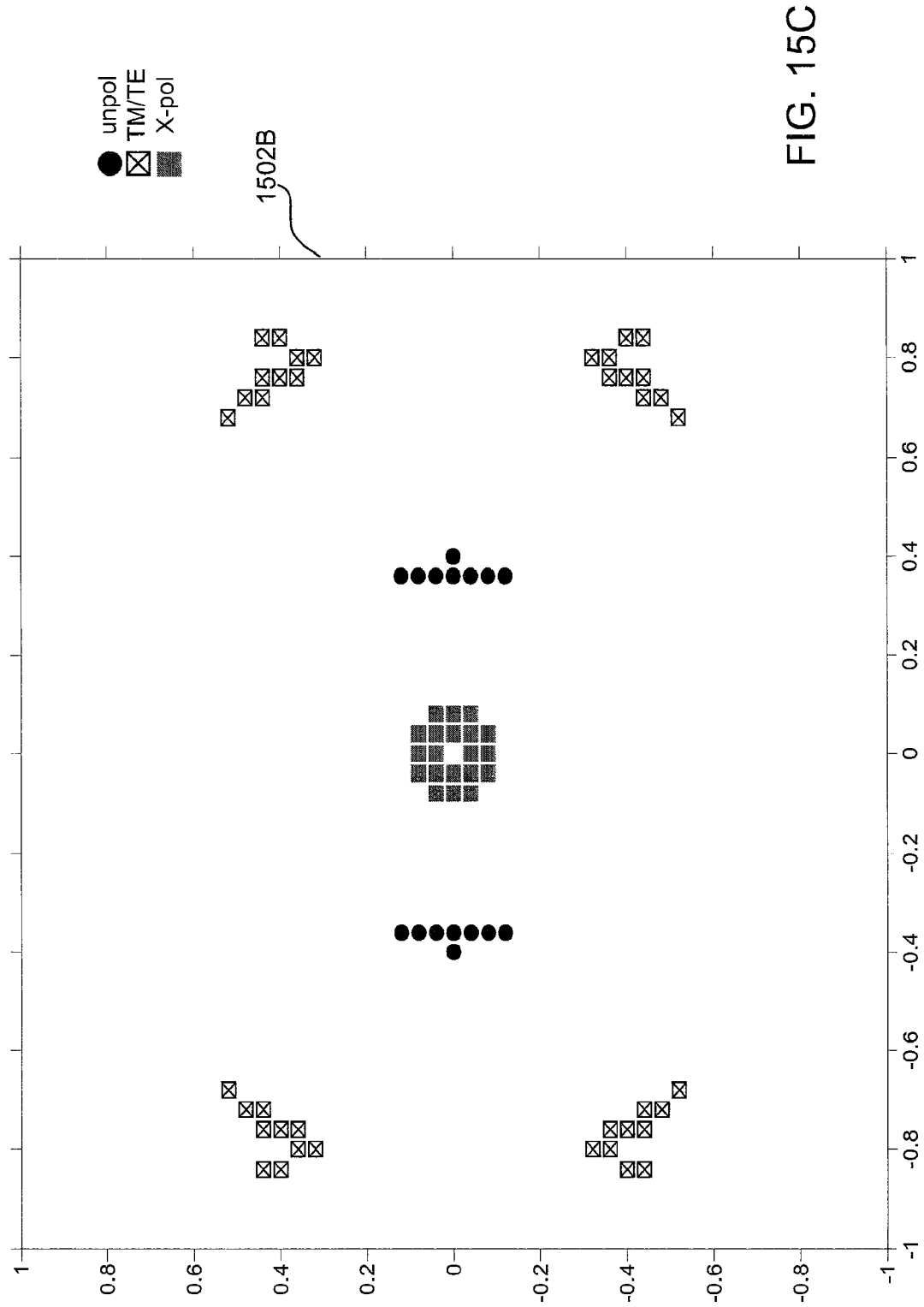

In another similar example shown in FIGS. 15A-C, the illumination spatial intensity map 1500 (FIG. 15A) is divided into polarization pixel groups. Initially, all the pixels have unpolarized illumination as shown in the modified map 1502A (FIG. 15B), corresponding to a CD metric value of 5.3 nm. After fine-tuning, the CD metric is improved to a value of 4.65 nm upon changing local polarization of the pixels groups, as shown in the modified map 1502B (FIG. 15C) with TM/TE at the poles and X-polarization at the center.

Figure 16A:
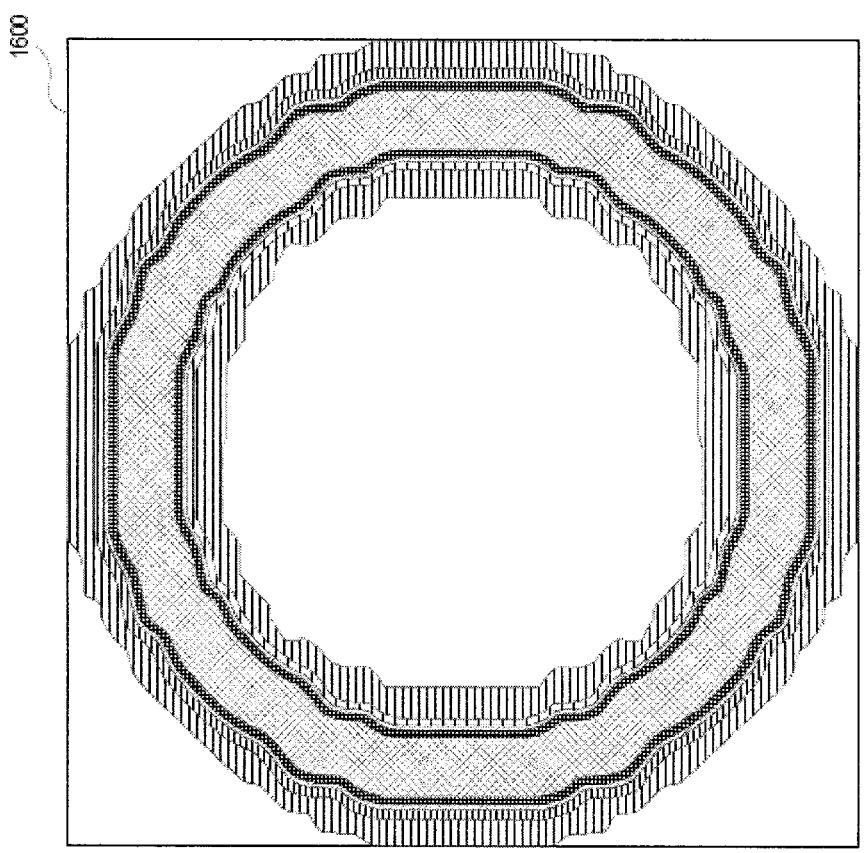
Figure 16B:
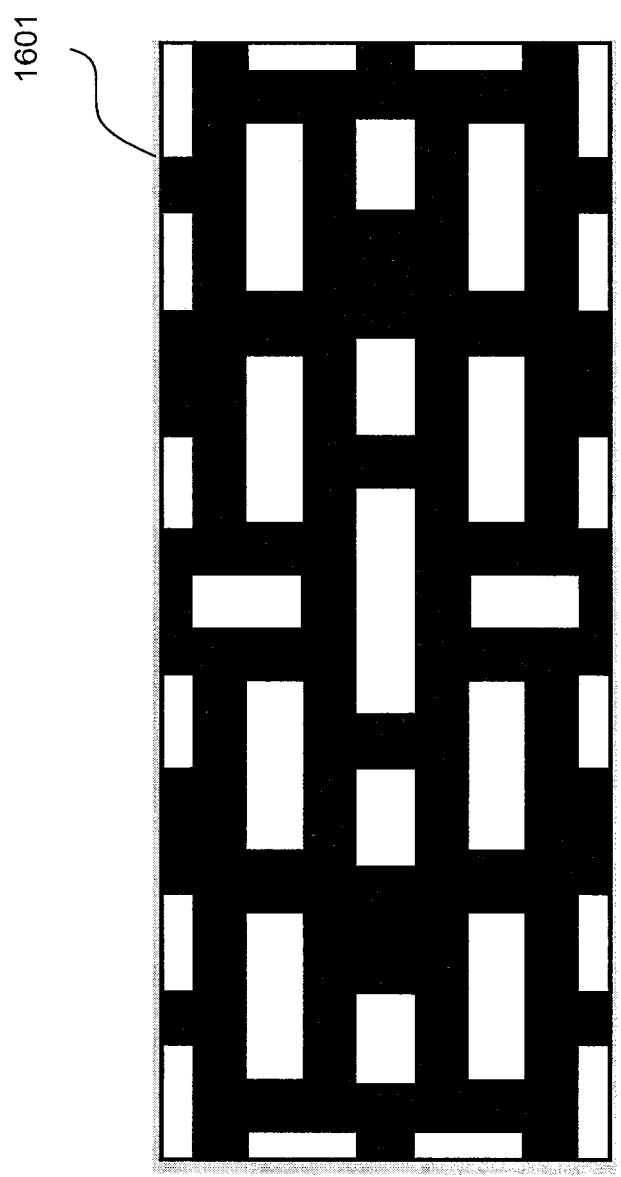
Figure 16C:
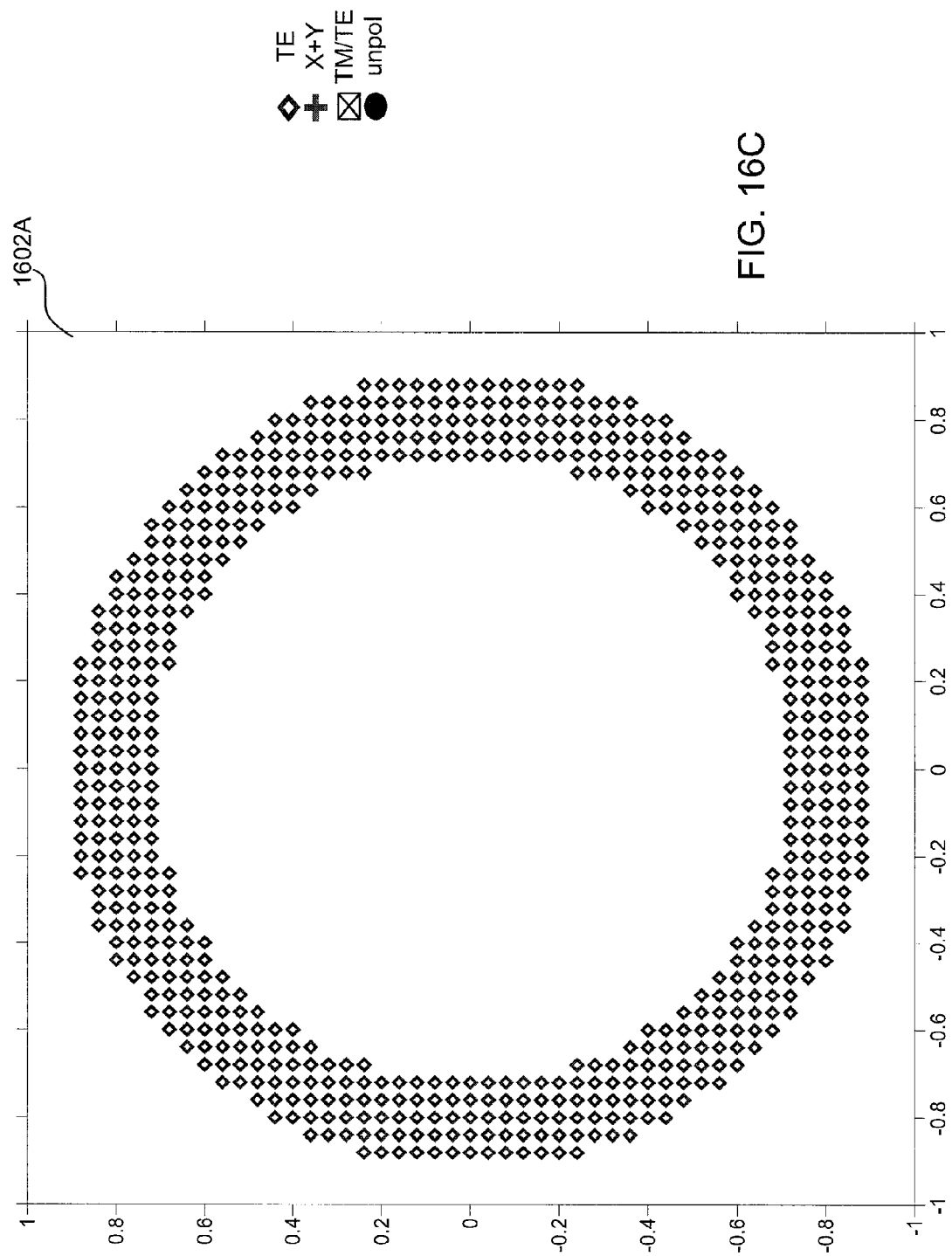
Figure 16D:
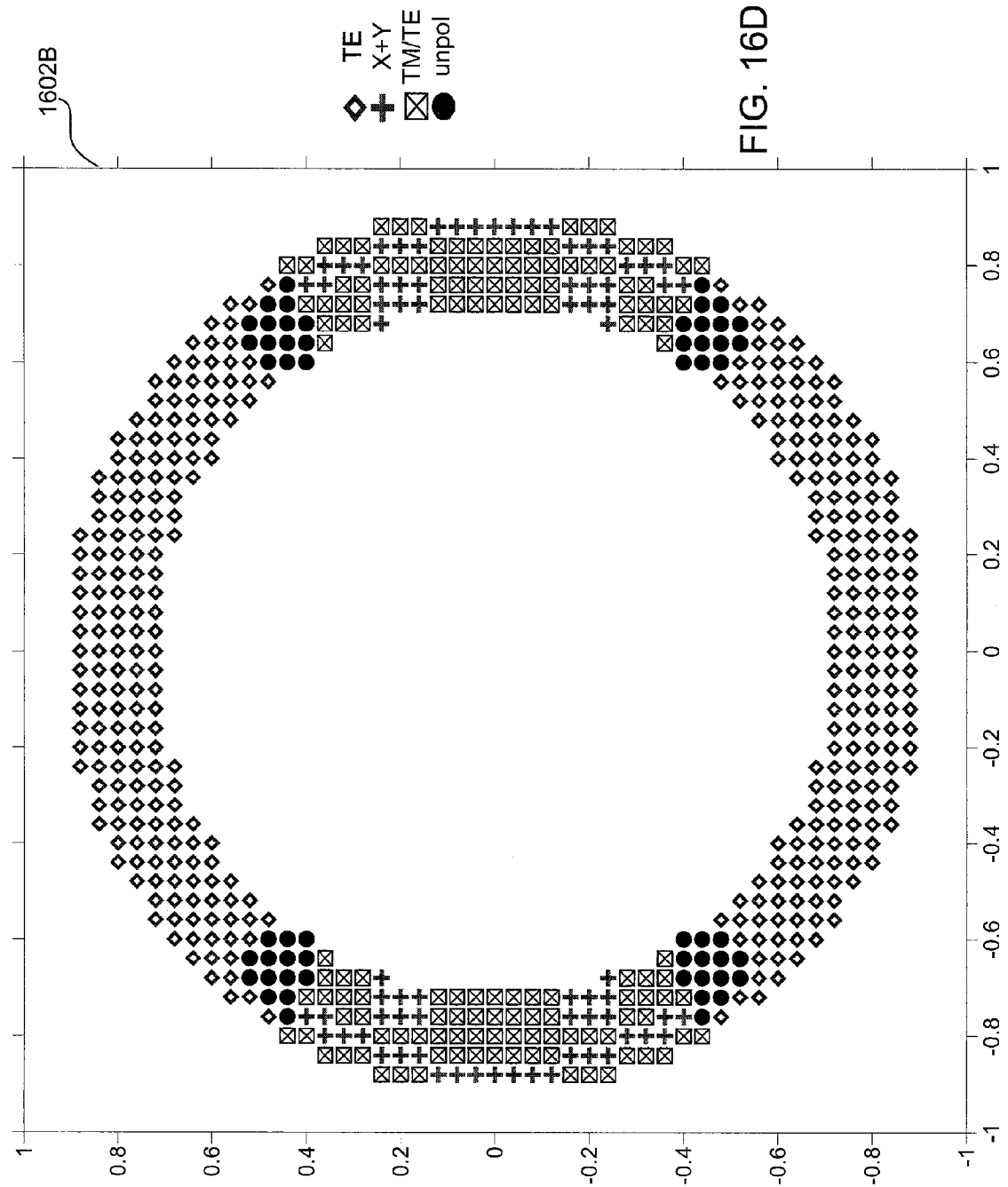

FIGS. 16 show further examples of polarization condition selection using an annular illumination having $\sigma_{outer}/\sigma_{inner}$ equal to 0.88/0.72, as shown in the intensity map 1600 in FIG. 16A. A binary dark field mask with a complex periodic 2-D pattern 1601 (FIG. 16B) is used. Using process 705, the best result was obtained with predefined TE polarization applied all across, as shown in map 1602A (FIG. 16C). The result was a CD error metric of 9.28 nm. For freeform polarization tuning, individual pixels are considered for polarization optimization. Instead of individual pixels, a large number of pixel groups may also be considered with immediately adjacent pixels. Map 1602B in FIG. 16D shows the fine-tuned polarization condition that offers CD error metric improvement. In that modified map, some of the specific illumination pixels or pixel groups were changed to TM/TE, X+Y, and unpolarized and the result is a CD metric of 8.93 nm.

Figure 17A:
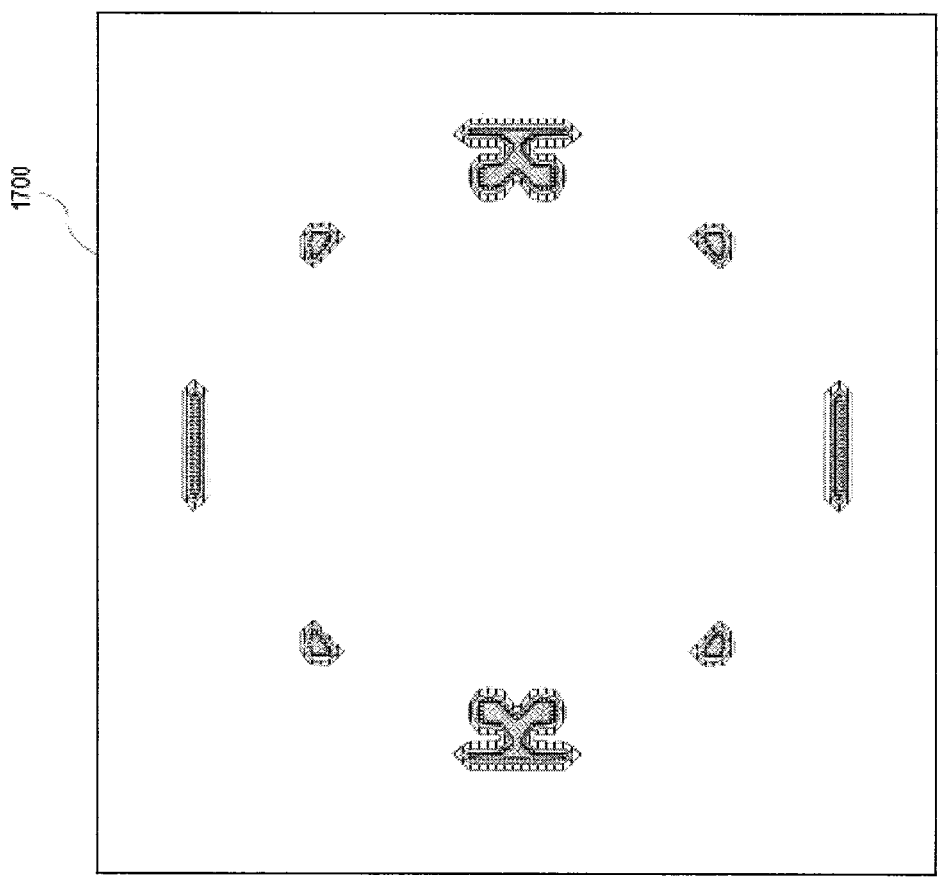
Figure 17B:
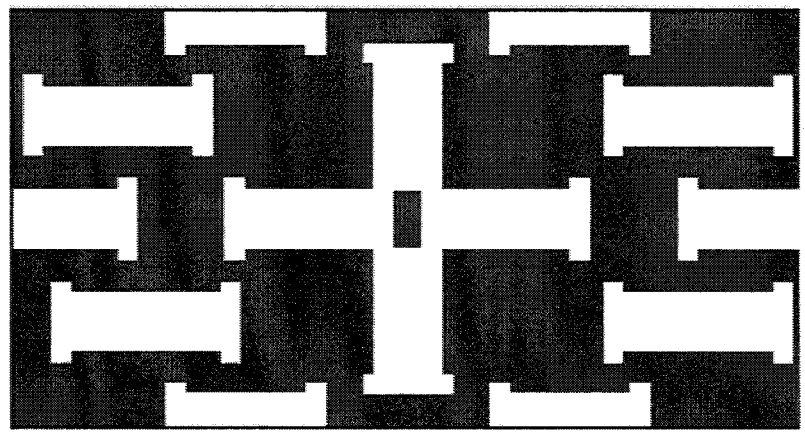
Figure 17C:
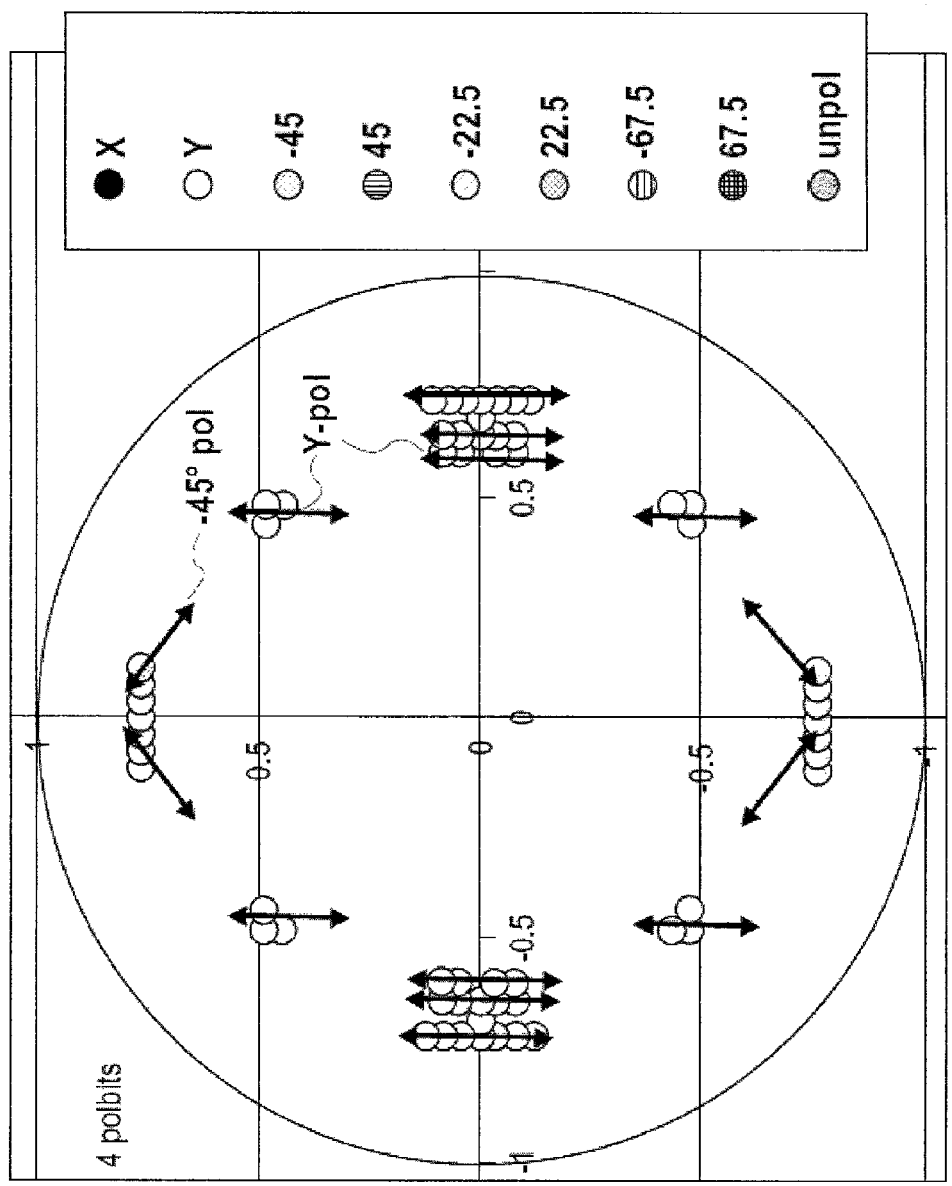
Figure 17D:
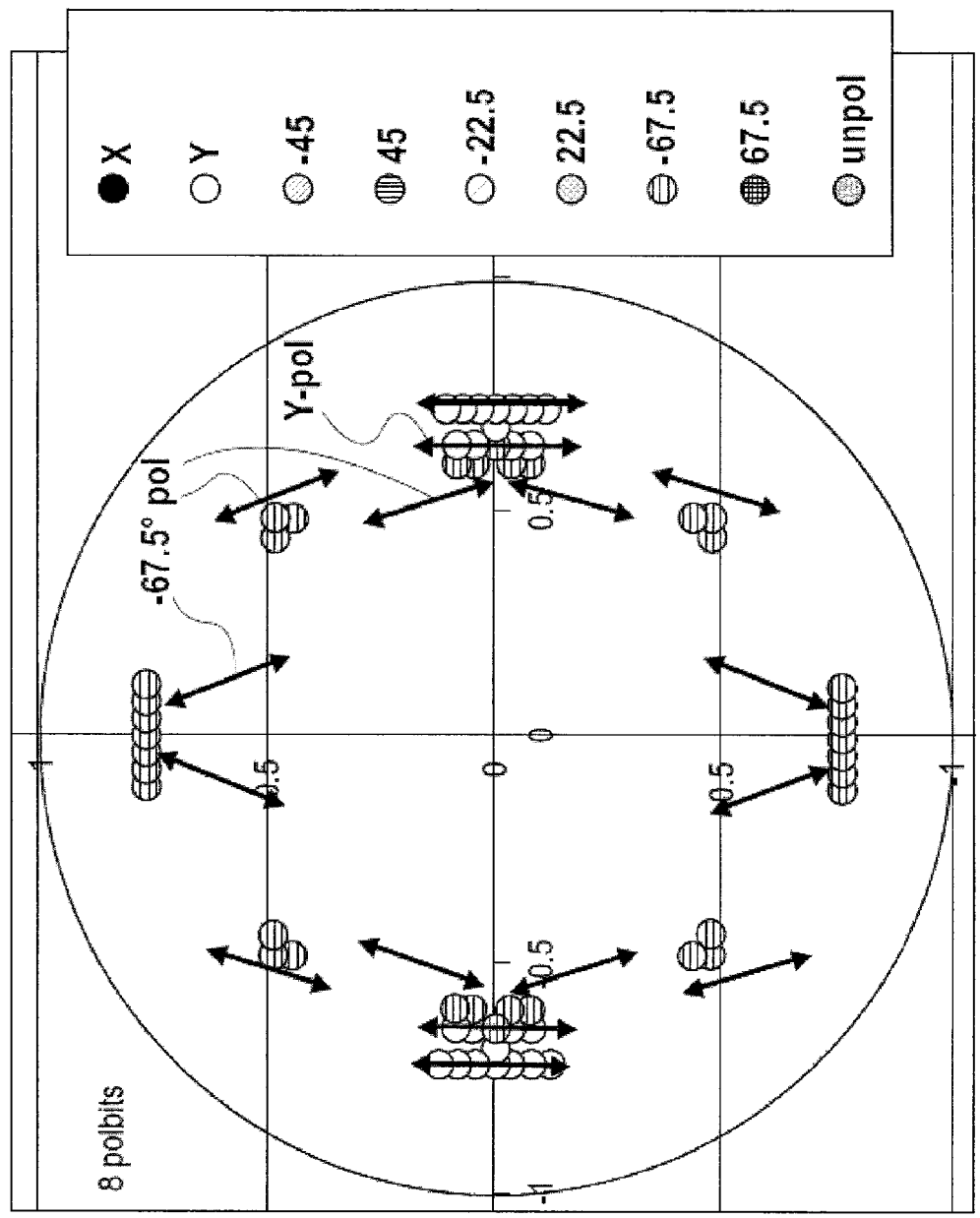

FIGS. 17C-D show an alternative way of expressing optimum polarization condition in a coordinate space that emphasizes on polarization direction angle, rather than the polarization type. A 4-polbit configuration can support X (0°), Y (90°), and ±45° directions for polarizations, and a 8-polbit configuration can support X, Y, ±45°, ±22.5°, and ±67.5° directions of polarizations, in the first quadrant of a space, similar to what is shown in FIG. 2G. FIG. 17A shows a spatial intensity map 1700 of a source, polarized uniformly with X-Y polarization in the entire source pupil plane. FIG. 17C-17D show how the spatial intensity map 1700 is discretized into groups of pixels in the pupil plane for 4-polbit and 8-polbit configurations, respectively. The arrows indicate the direction of polarization for a pixel group. In FIG. 17C, only the top and the bottom pixel groups are at −45° polarization (i.e. −45° in first quadrant, and appropriate angles in the other quadrants maintaining the symmetry). The rest of the pixels in the other pixel groups are at Y-polarization. In FIG. 17D, pixels are either −67.5° polarized (with appropriate symmetry in the other quadrants), or Y-polarized. With 8-polbit configuration, the granularity of polarization optimization at each pixel is increased, and as a result, a better lithographic response is obtained. For example, with fixed X+Y polarized radiation, for a pattern shown in FIG. 17B, the CD variation metric obtained from a conventional SMO is 8.92%. With the same source and same pattern, but with the addition of polarization optimization (4-polbit) as shown in FIG. 17C, the CD variation metric is improved to 8.61%. Further improvement of the CD variation metric to 8.09% may be obtained using the same source, and same pattern, but using a 8-polbit polarization optimization, as shown in FIG. 17D.

Figure 18C:
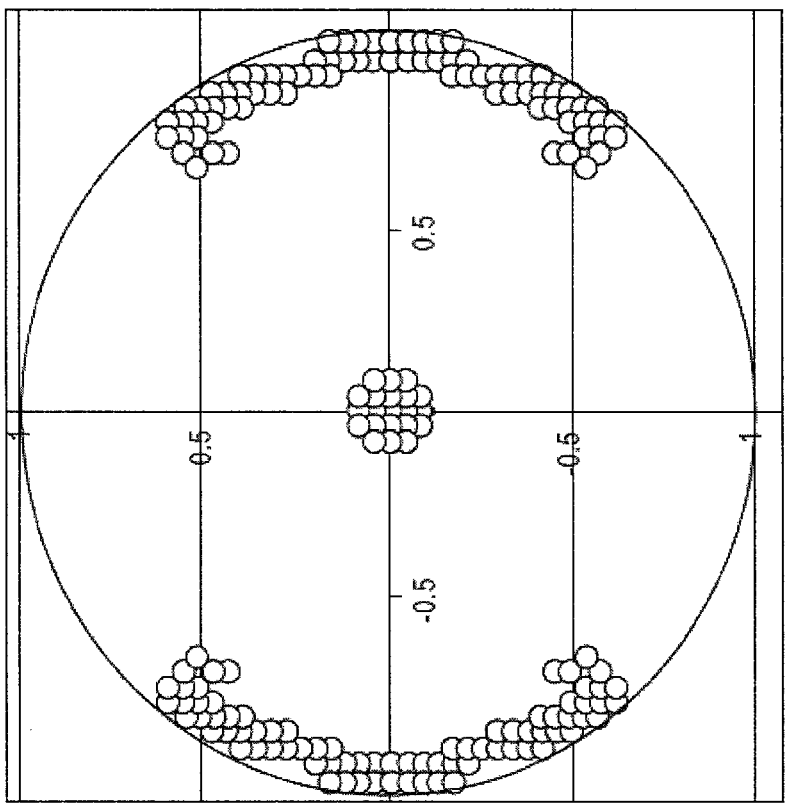
FIGS. 18A-E compares results of SMPO versus conventional SMO.
Figure 18A:
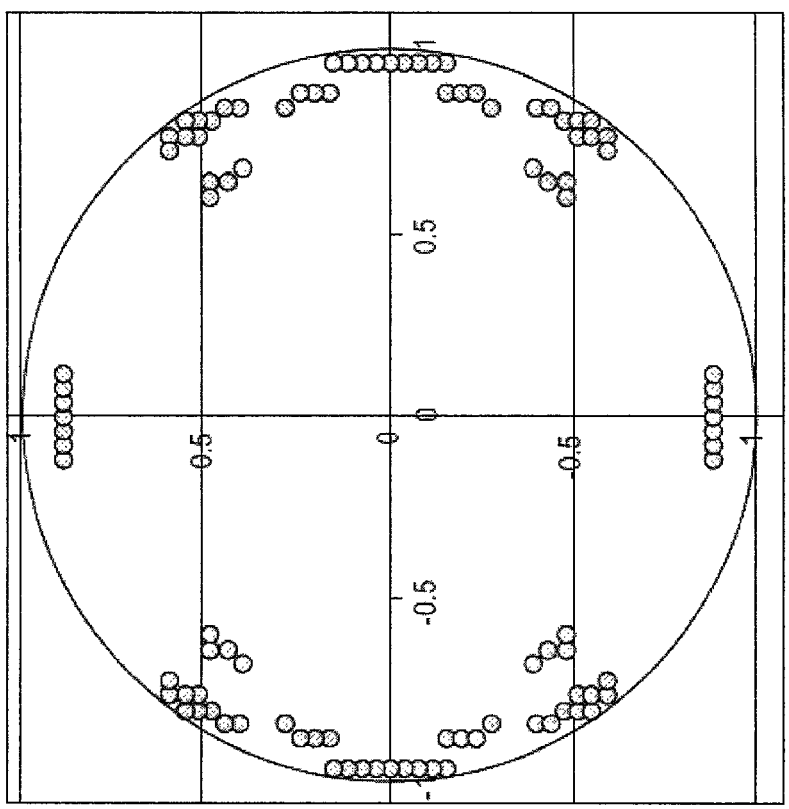
Figure 18D:
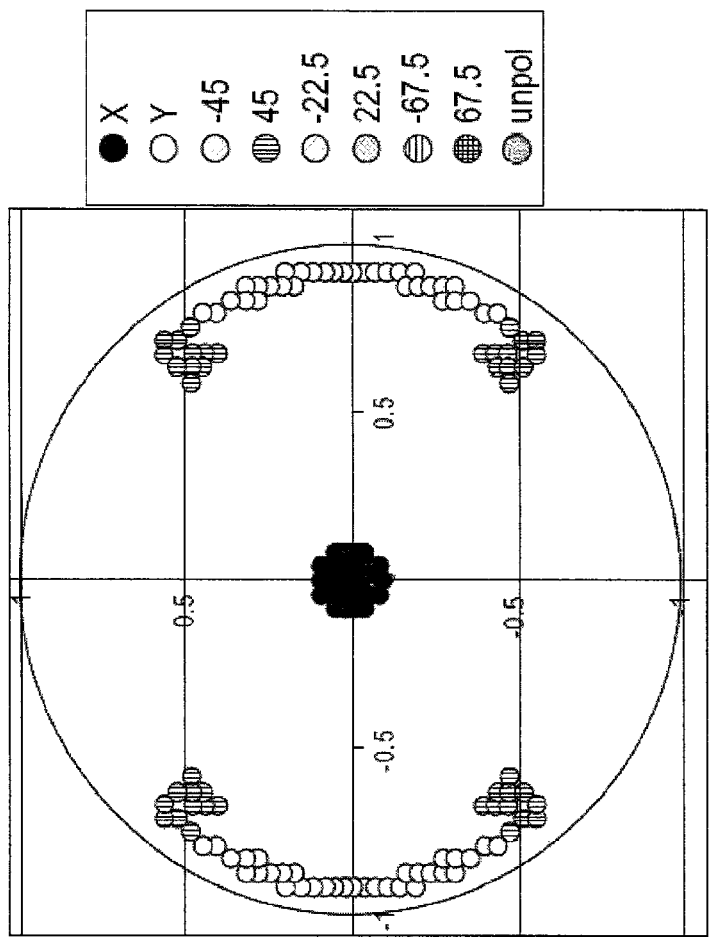
Figure 18B:
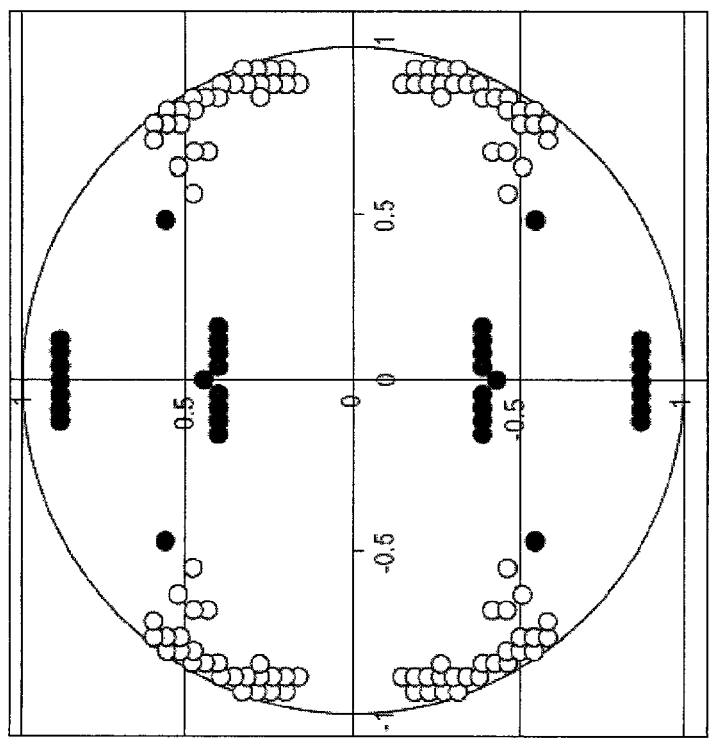
Figure 18E:
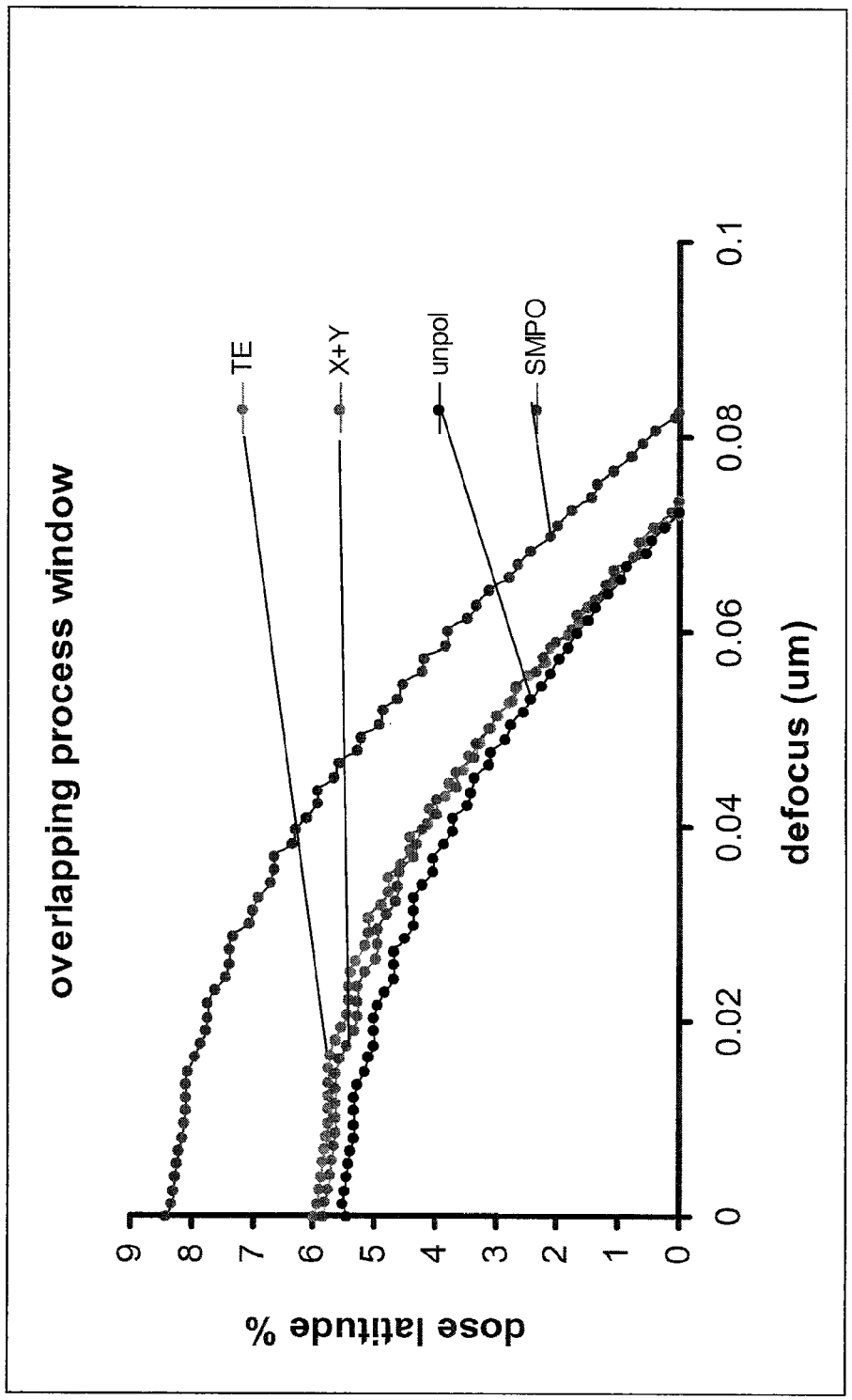

FIGS. 18A-D compare discretized intensity maps of an identical source as a result of SMO (or SMPO) for different polarization conditions. These are optimized sources for various polarization condition assumptions for a pattern as shown in FIG. 5B. FIG. 18A shows a TE polarized source optimized using conventional SMO. FIG. 18B shows a X+Y polarized source optimized using conventional SMO. FIG. 18C shows an unpolarized source optimized using conventional SMO. FIG. 18D shows the same source optimized using the enhancements discussed in the present application, i.e. optimized using SMPO. FIG. 18E shows the overlapping process window is the best (i.e. maximum dose amplitude and maximum depth of focus are allowed) for SMPO (the case in FIG. 18D), compared to a TE polarized source (FIG. 18A), a X+Y polarized source (FIG. 18B), and unpolarized source (FIG. 18C).

Polarization and Dark-Field Radiation

To further demonstrate the advantages of the polarization optimization techniques described above, SMPO may be applied to dark field illumination. Dark field imaging includes illumination with σ>1. For example, a typical range is 1.4≥σ≥1.0. The addition of dark-field radiation has the potential to improve lithographic imaging through MEEF reduction.

SMPO techniques described above use fixed dose/bias with multiple starting points and finishing points for dose/bias optimization. Including dark-field affects the dose/bias relationships (dark field solutions usually need higher dose) .Therefore the optimization procedure may be modified to fix mask bias (post-OPC) by allowing the dose to dynamically adjust during optimization.

Figure 19A:
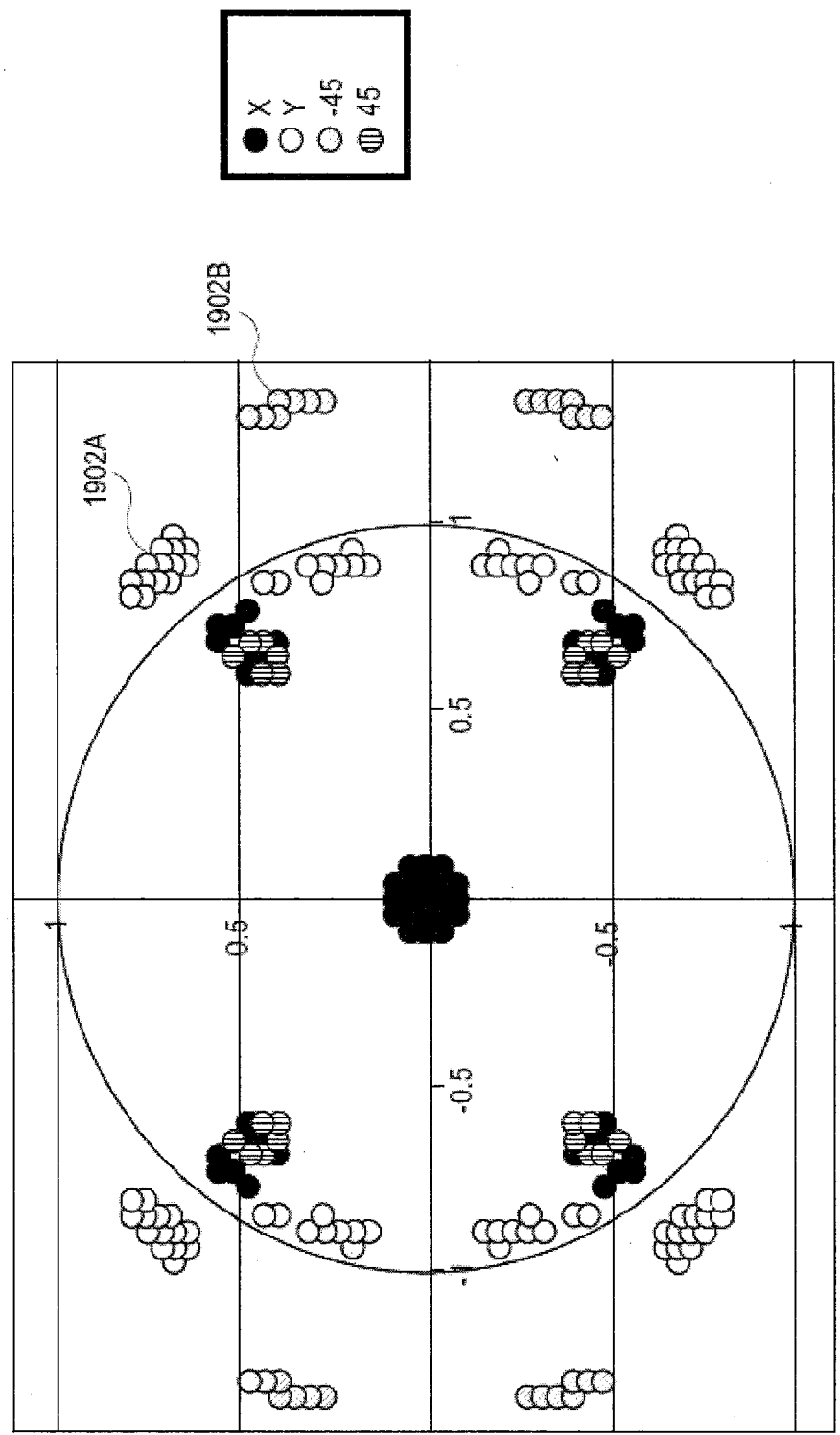
FIGS. 19A-E illustrate benefits of using dark field illumination and Y+X polarization.
Figure 19C:
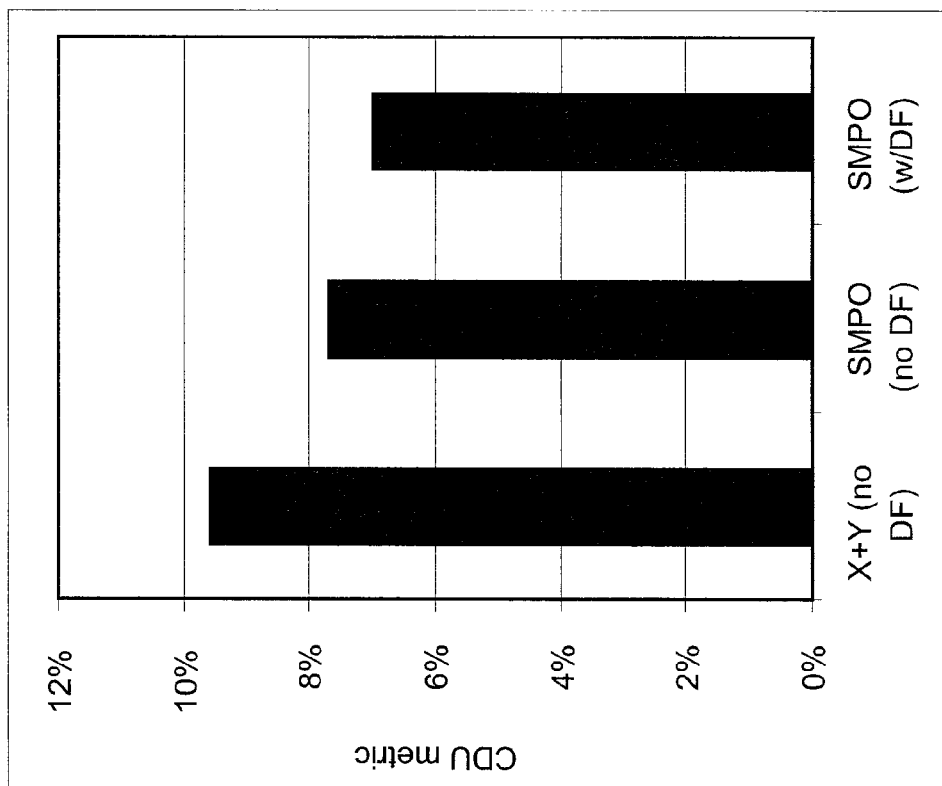
Figure 19B:
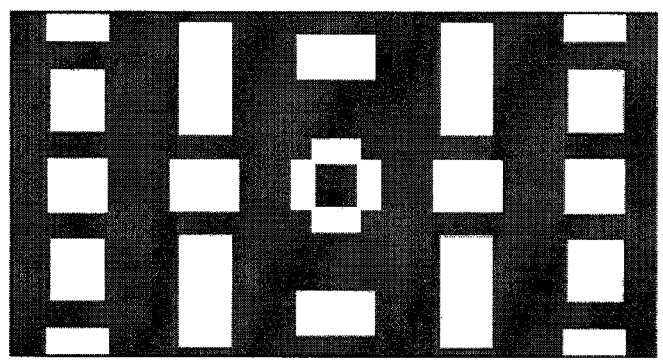
Figure 19D:
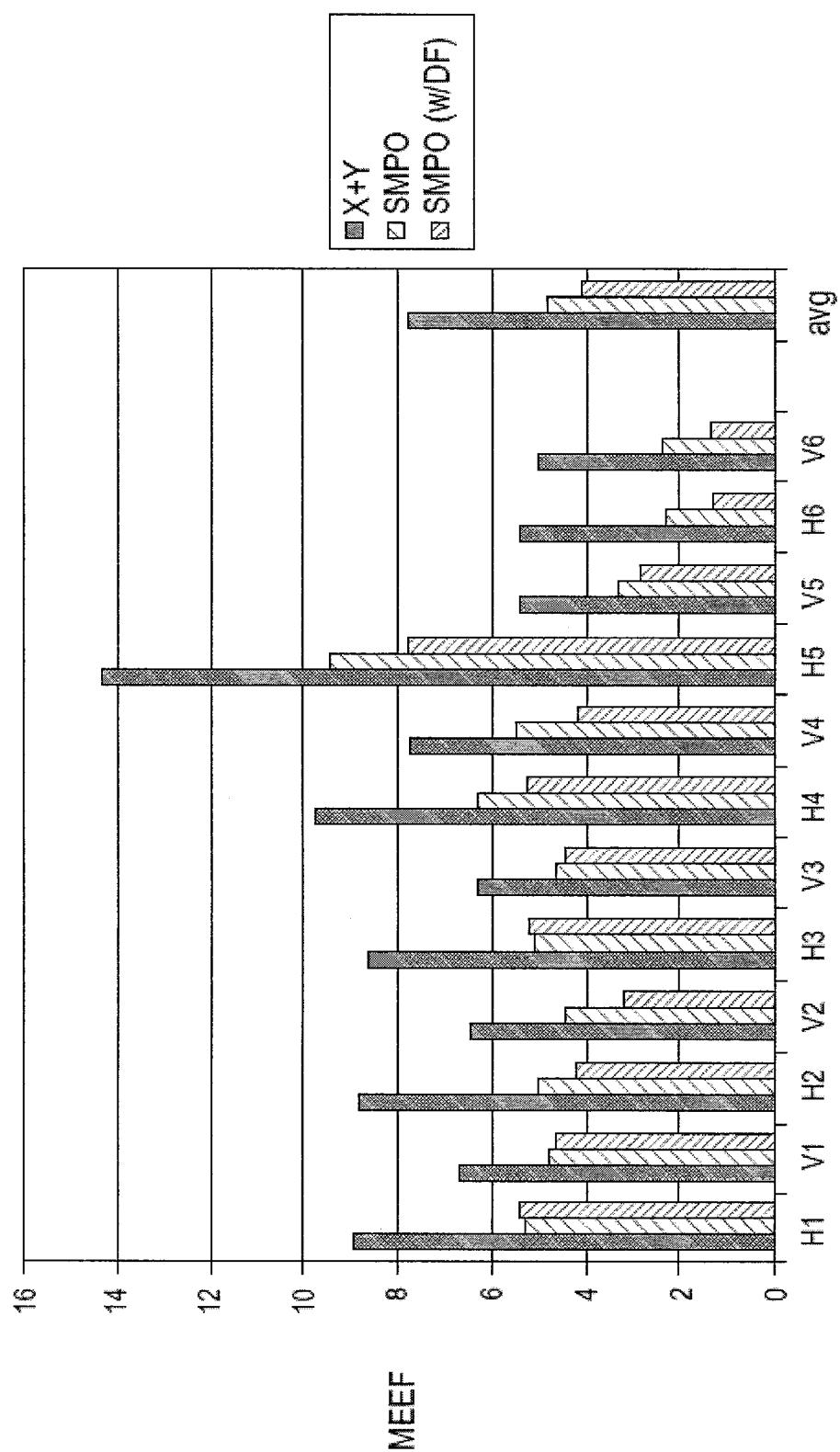
Figure 19E:
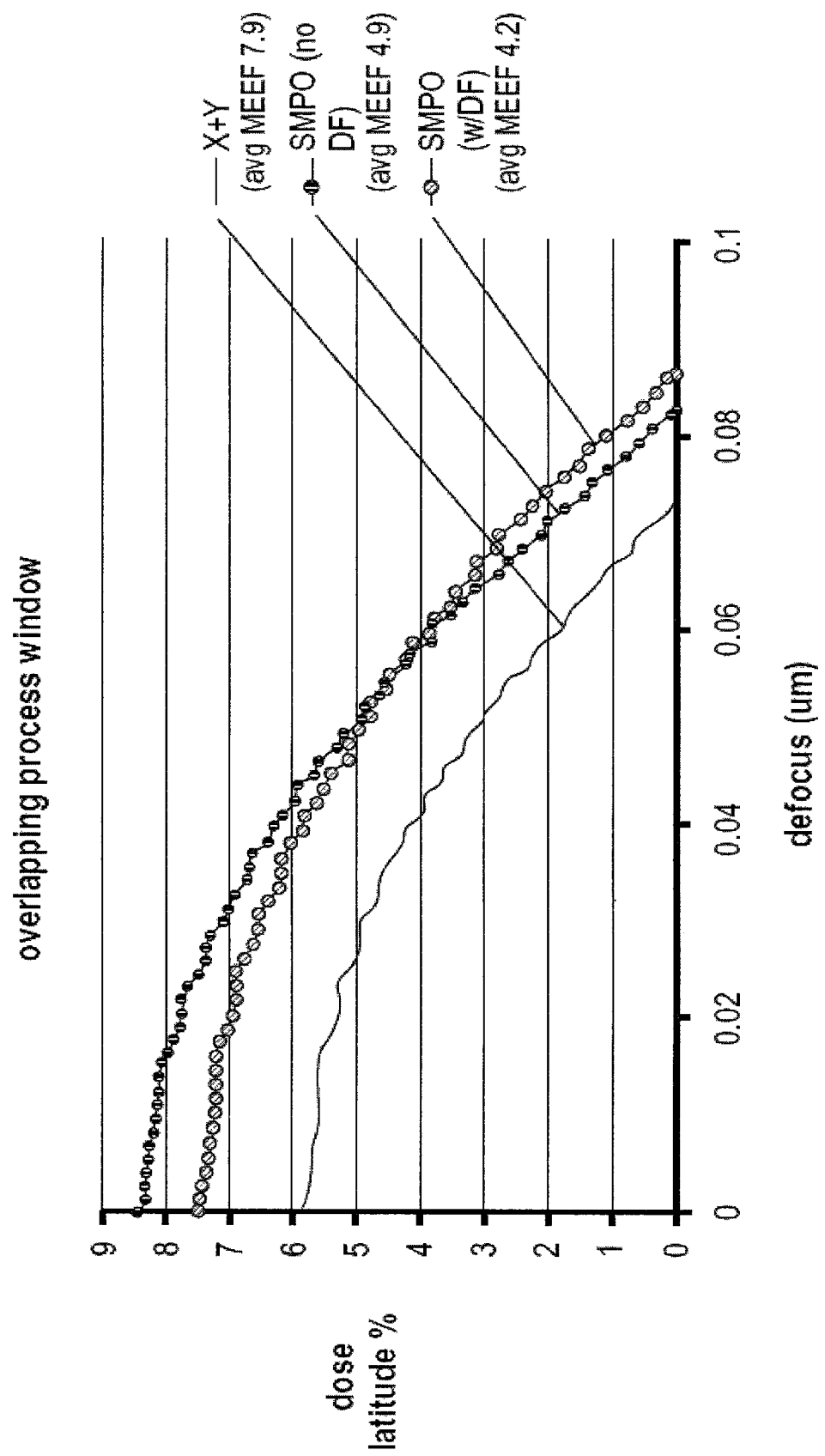

Since, for a dark field condition, poles of an illumination intensity map can be outside the projection system aperture, additional pixels or pixel groups were added per quadrant to cover the region 1.4≥σ≥1.0. For example, FIG. 19A shows additional pixel groups 1902A-B (also repeated symmetrically in all quadrants) outside the source aperture. Only 4 polarization conditions (X, Y, and ±45°) are used here for SMPO with dark-field. Standard SMPO (without dark field) may give 19% better CDU (CD uniformity) than a fixed X+Y polarization solution for certain test patterns shown in FIG. 19B. SMPO with dark-field offers further 9% improvement in CDU metric, as shown in FIG. 19C. FIG. 19D shows that the benefit of MEEF reduction in SMPO is further enhanced when dark-field radiation is used. Compared to a fixed X+Y polarization solution, which has an average MEEF of 7.9, SMPO without dark field provides an average MEEF of 4.9, which is further reduced to 4.2 when SMPO with dark field is used. MEEF reductions at individual horizontal (H) and vertical (V) cutlines at different locations within the pattern in FIG. 19B are averaged to come up with the average (avg) MEEF values shown in FIG. 19D. FIG. 19E shows comparison of overlapping process windows when SMPO is performed under dark-field conditions vs. SMPO without dark field, and SMO with X+Y polarization. In general, dark-field SMPO offers MEEF reduction and CDU improvement when standard dark-field mask and positive tone development process are used.

Dependence on Patterning Device Type

Figures 20A, 20B:
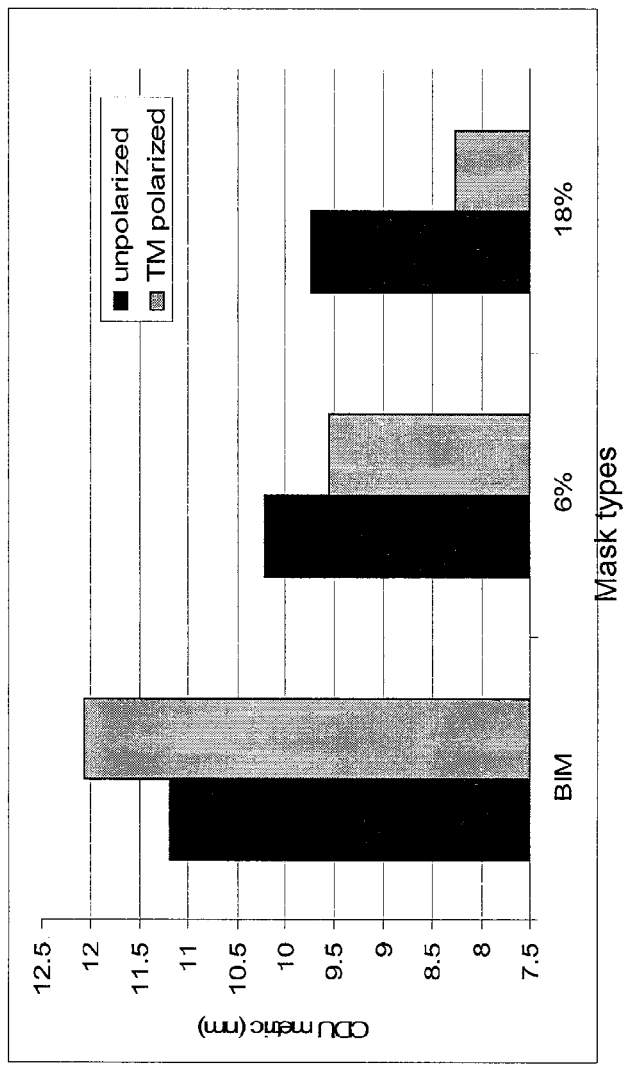
FIGS. 20A-B show an example of how optimized polarization condition depends on patterning device type.

FIG. 20 shows that the polarization fine-tuning depends on the type of patterning device used. Using a 50 nm hole grid on 114 nm square pitch (k1=0.4) at 4-pole illumination, mask bias was varied and mask transmission type was also varied. The results are shown in the table 2002 in FIG. 20B. FIG. 20A graphically shows the result comparison. It is shown that 18% Att-PSM gives better result than a standard binary mask (BIM) and a 6% Att-PSM, especially when TM polarization is used instead of unpolarized Similar comparison may be studied for other polarization conditions.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof The patterning device is moved out of the resist leaving a pattern in it after the resist is cured.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions configured to cause performance of a method as disclosed above, or a computer-readable data storage medium (e.g. semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. A method of improving a transfer of an image of a patterning device layout onto a substrate with a lithographic apparatus, the method comprising:
   performing a first process corresponding to each of a plurality of predefined polarization conditions to select a predefined polarization condition that results in a lithographic response value associated with relatively better reproduction of a critical feature; and
   performing a second process to iteratively arrive at a desired spatially varying freeform polarization condition that results in a desired value of the lithographic response, wherein the second process uses one or more of the predefined polarization conditions used in the first process.

2. The method of claim 1, comprising:
   obtaining a set of test features emulating at least a portion of the patterning device layout that includes the critical feature;
   defining a performance metric representing a variation of a lithographic response in reproducing the critical feature over one or more process parameters; and
   selecting the plurality of predefined polarization conditions.

3. The method of claim 2, wherein the process parameters include one or more selected from: focus, exposure dose, exposure wavelength, patterning device attenuation, patterning device bias, test feature size error, test feature size non-uniformity, numerical aperture, illumination shape, and patterning device field type.

4. The method of claim 1, comprising updating a performance metric with the lithographic response values obtained from the first process, and the second process involves iteratively further updating the performance metric until the desired value of the lithographic response is obtained.

5. The method of claim 1, wherein the second process comprises:
   obtaining a candidate illumination spatial intensity map;
      dividing bright illumination points in the spatial intensity map into distinct pixels or pixel groups;
      tuning local polarization of the distinct pixels or pixel groups by applying each of a set of predefined polarization conditions to each of the distinct pixels or pixel groups; and
   selecting the spatially varying freeform polarization condition that results in a desired value of the lithographic response.

6. The method of claim 1, wherein the plurality of predefined polarization conditions comprises two or more polarization conditions selected from the group comprising: no polarization, TE polarization, TM polarization, TM/TE polarization, diagonal polarization, X-polarization, Y-polarization, X+Y polarization, Y+X polarization, or any combination thereof.

7. The method of claim 1, wherein the plurality of predefined polarization conditions comprises TM/TE polarization.

8. The method of claim 1, wherein the lithographic response includes one or more selected from: critical linewidth non-uniformity, critical dimension error, aspect ratio error, pitch error, side edge placement error, corner edge placement error, patterning device error enhancement factor (MEEF), dose latitude, focus latitude, or any combination thereof.

9. The method of claim 1, wherein the first process comprises obtaining a respective illumination spatial intensity map for each of the plurality of polarization conditions.

10. The method of claim 1, wherein the first process comprises determining a normalized image log slope (NILS) value for each of the plurality of polarization conditions, and selecting the one or more polarization conditions corresponding to high NILS values to form a reduced set.

11. The method of claim 1, wherein the plurality of predefined polarization conditions includes a TM/TE polarization, where in a pupil plane of the radiation system, TM polarization is applied along diagonals, and in each quadrant of the pupil plane, TM polarization gradually and symmetrically transforms into TE polarization at Cartesian axes.

12. The method of claim 11, wherein only TM polarization, only TE polarization, only X polarization, only Y polarization, only diagonal polarization, or a combination thereof is applied within a radius of the pupil plane with a value of σ less than or equal to 0.3.

13. The method of claim 1, wherein the plurality of predefined polarization conditions comprises fixed angle polarizations.

14. The method of claim 1, comprising including dark field illumination with σ>1 to illuminate the patterning device layout.

15. The method of claim 14, wherein the plurality of predefined polarization conditions includes Y+X polarization.

16. A non-transitory computer storage product having machine executable instructions, the instructions being executable by a machine to perform a method of configuring a transfer of an image of a patterning device layout onto a substrate with a lithographic apparatus, the method comprising:
  performing a first process corresponding to each of a plurality of predefined polarization conditions to select a predefined polarization condition that result in a lithographic response value associated with relatively better reproduction of a critical feature; and
  performing a second process to iteratively arrive at a desired spatially varying freeform polarization condition that results in a desired value of the lithographic response, wherein the second process uses one or more of the predefined polarization conditions used in the first process.

17. A device manufacturing method, comprising:
  projecting a patterned beam of radiation in a lithographic apparatus onto a radiation sensitive substrate, wherein the patterned beam has a TM/TE polarization condition that comprises:
  TM polarization along diagonals of a pupil plane of the lithographic apparatus, and
  TE polarization at each of the Cartesian axes of the pupil plane,
  wherein an effective polarization direction of substantially all the radiation between one Cartesian axis and one of the diagonals is rotated by less than 45 degrees going from the one Cartesian axis to the one of the diagonals and an effective polarization direction of substantially all the radiation between another Cartesian axis and the same one of the diagonals is rotated by less than 45 degrees going from the other Cartesian axis to the same one of the diagonals.

18. The method of claim 17, wherein the TM polarization gradually and symmetrically transforms into TE polarization at each of the Cartesian axes.

19. A device manufacturing method, comprising:
  projecting a patterned beam of radiation in a lithographic apparatus onto a radiation sensitive substrate, wherein the patterned beam has a spatially varying polarization condition created by a transmissive polarization plate and/or a diffractive optical element and the spatially varying polarization condition has:
  a TM/TE polarization condition that comprises TM polarization along diagonals of a pupil plane of the lithographic apparatus and TE polarization in each quadrant of the pupil plane, and
  a central region of the pupil plane, within the TM/TE polarization condition, of linearly polarized radiation, substantially only TM radiation, or substantially only TE radiation.

20. The method of claim 19, wherein the method comprises including dark field illumination with σ>1 in the beam of radiation to illuminate a patterning device that patterns the beam of radiation.

* * * * *